US010827297B2

(12) United States Patent
Liu et al.

(10) Patent No.: US 10,827,297 B2
(45) Date of Patent: Nov. 3, 2020

(54) MULTI-CHANNEL SIGNAL ENCODING METHOD, MULTI-CHANNEL SIGNAL DECODING METHOD, ENCODER, AND DECODER

(71) Applicant: Huawei Technologies Co., Ltd., Shenzhen (CN)

(72) Inventors: Zexin Liu, Beijing (CN); Lei Miao, Beijiing (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/601,104

(22) Filed: Oct. 14, 2019

(65) Prior Publication Data
US 2020/0045494 A1 Feb. 6, 2020

Related U.S. Application Data

(63) Continuation of application No. PCT/CN2018/077790, filed on Mar. 1, 2018.

(30) Foreign Application Priority Data

Apr. 12, 2017 (CN) .......................... 2017 1 0236773

(51) Int. Cl.
*H04S 7/00* (2006.01)
*G10K 15/08* (2006.01)
(Continued)

(52) U.S. Cl.
CPC .............. *H04S 7/305* (2013.01); *G10K 15/08* (2013.01); *G10L 19/008* (2013.01); *G10L 19/173* (2013.01); *G10L 19/22* (2013.01)

(58) Field of Classification Search
CPC ....... H04S 7/305; G10K 15/08; G10L 19/008; G10L 19/173; G10L 19/22
See application file for complete search history.

(56) References Cited

U.S. PATENT DOCUMENTS 5,731,767 A 3/1998 Tsutsui et al.
5,960,390 A 9/1999 Ueno et al.
(Continued)

FOREIGN PATENT DOCUMENTS

CN 1153369 A 7/1997
CN 1411171 A 4/2003
(Continued)

OTHER PUBLICATIONS

Machine Translation and Abstract of Chinese Publication No. CN101350197, Jan. 21, 2009, 24 pages.
(Continued)

*Primary Examiner* — Andrew L Sniezek
(74) *Attorney, Agent, or Firm* — Conley Rose, P.C.

(57) ABSTRACT

A multi-channel signal encoding method includes determining a downmixed signal of a first channel signal and a second channel signal in a multi-channel signal, and reverberation gain parameters corresponding to different subbands of the first channel signal and the second channel signal, determining a target reverberation gain parameter that needs to be encoded in the reverberation gain parameters corresponding to the different subbands of the first channel signal and the second channel signal, generating parameter indication information, where the parameter indication information is used to indicate a subband corresponding to the target reverberation gain parameter, and encoding the target reverberation gain parameter, the parameter indication information, and the downmixed signal to generate a bitstream.

24 Claims, 13 Drawing Sheets

(51) Int. Cl.
*G10L 19/008* (2013.01)
*G10L 19/16* (2013.01)
*G10L 19/22* (2013.01)

(56) References Cited

U.S. PATENT DOCUMENTS

| | | | |
|---|---|---|---|
| 8,804,971 | B1 | 8/2014 | Williams et al. |
| 8,831,960 | B2 | 9/2014 | Shirakawa et al. |
| 2007/0271095 | A1 | 11/2007 | Miyasaka et al. |
| 2008/0071549 | A1* | 3/2008 | Chong ................ G10L 19/008 704/500 |
| 2009/0234657 | A1 | 9/2009 | Takagi et al. |
| 2013/0054253 | A1 | 2/2013 | Shirakawa et al. |
| 2013/0343551 | A1 | 12/2013 | Moon et al. |
| 2016/0240206 | A1 | 8/2016 | Purnhagen et al. |
| 2019/0311724 | A1 | 10/2019 | Hirvonen et al. |
| 2020/0027466 | A1* | 1/2020 | Liu ........................ G10L 19/008 |
| 2020/0045494 | A1 | 2/2020 | Liu et al. |
| 2020/0152210 | A1* | 5/2020 | Briand .................... H04S 3/008 |

FOREIGN PATENT DOCUMENTS

| | | |
|---|---|---|
| CN | 101010724 A | 8/2007 |
| CN | 101162904 A | 4/2008 |
| CN | 101253556 A | 8/2008 |
| CN | 101350197 A | 1/2009 |
| CN | 105164749 A | 12/2015 |
| CN | 105229731 A | 1/2016 |
| CN | 105659320 A | 6/2016 |
| CN | 108694955 A | 10/2018 |
| EP | 1921606 A1 | 5/2008 |
| EP | 3089483 A1 | 11/2016 |
| KR | 20060109299 A | 10/2006 |
| KR | 20070088958 A | 8/2007 |
| WO | 2014187989 A2 | 11/2014 |

OTHER PUBLICATIONS

Machine Translation and Abstract of Korean Publication No. KR20060109299, Oct. 19, 2006, 22 pages.

Foreign Communication From a Counterpart Application, European Application No. 18784927.8, Extended European Search Report dated Feb. 21, 2020, 10 pages.

Foreign Communication From a Counterpart Application, Chinese Application No. 201710236773.3, Chinese Office Action dated Mar. 4, 2020, 5 pages.

Foreign Communication From a Counterpart Application, Chinese Application No. 201710236773.3, Chinese Search Report dated Feb. 26, 2020, 3 pages.

Machine Translation and Abstract of Chinese Publication No. CN101162904, Apr. 16, 2008, 18 pages.

Foreign Communication From a Counterpart Application, PCT Application No. PCT/CN2018/077790, English Translation of International Search Report dated May 31, 2018, 3 pages.

Foreign Communication From a Counterpart Application, PCT Application No. PCT/CN2018/077790, English Translation of Written Opinion dated May 31, 2018, 6 pages.

* cited by examiner

MULTI-CHANNEL SIGNAL ENCODING METHOD, MULTI-CHANNEL SIGNAL DECODING METHOD, ENCODER, AND DECODER

CROSS-REFERENCE TO RELATED APPLICATIONS

This application is a continuation of International Patent Application No. PCT/CN2018/077790, filed on Mar. 1, 2018, which claims priority to Chinese Patent Application No. 201710236773.3, filed on Apr. 12, 2017. The disclosures of the aforementioned applications are hereby incorporated by reference in their entireties.

TECHNICAL FIELD

This application relates to the audio encoding field, and more specifically, to a multi-channel signal encoding method, a multi-channel signal decoding method, an encoder, and a decoder.

BACKGROUND

As living quality is improved, people have increasing demands on high-quality audio. Compared with mono audio, stereo audio provides a sense of orientation and a sense of distribution for each sound source, and provides improved clarity, intelligibility, and on-site feeling of sound. Therefore, stereo audio is very popular.

Stereo processing technologies mainly include mid/side (MS) encoding, intensity stereo (IS) encoding, and parametric stereo (PS) encoding.

In other approaches, when the PS encoding is used to encode a multi-channel signal, an encoder side needs to calculate a reverberation gain parameter corresponding to each subband of a channel signal, and encode the reverberation gain parameter corresponding to each subband of the channel signal, so that a decoder side can perform reverberation processing on each subband of the channel signal based on the reverberation gain parameter corresponding to each subband of the channel signal. However, a relatively large quantity of bits need to be occupied for encoding the reverberation gain parameter corresponding to each subband of the channel signal, and in some cases, performing reverberation processing on each subband of the channel signal causes a worse auditory effect.

SUMMARY

This application provides a multi-channel signal encoding method, a multi-channel signal decoding method, an encoder, and a decoder, to improve encoding efficiency.

According to a first aspect, a multi-channel signal encoding method is provided, where the method includes determining a downmixed signal of a first channel signal and a second channel signal in a multi-channel signal, and reverberation gain parameters corresponding to different subbands of the first channel signal and the second channel signal, determining a target reverberation gain parameter that needs to be encoded in the reverberation gain parameters corresponding to the different subbands of the first channel signal and the second channel signal, generating parameter indication information, where the parameter indication information is used to indicate a subband corresponding to the target reverberation gain parameter, and encoding the target reverberation gain parameter, the parameter indication information, and the downmixed signal to generate a bitstream.

In this application, when the first channel signal and the second channel signal are being encoded, reverberation gain parameters corresponding to only some subbands of the first channel signal and the second channel signal may be encoded. Compared with a manner in other approaches in which reverberation gain parameters corresponding to all subbands of the first channel signal and the second channel signal need to be encoded, bit overheads can be reduced to some extent, and encoding efficiency can be improved. Further, a quantity of saved bits may be used to encode another parameter or allocate more bits to the downmixed signal if reverberation gain parameters corresponding to some subbands are encoded, thereby improving overall encoding performance.

With reference to the first aspect, in some implementations of the first aspect, the determining a target reverberation gain parameter that needs to be encoded in the reverberation gain parameters corresponding to the different subbands of the first channel signal and the second channel signal includes determining the target reverberation gain parameter based on at least one of energy of the first channel signal and energy of the second channel signal, an inter-channel coherence (IC) between the first channel signal and the second channel signal, energy of the downmixed signal, and an inter-channel level difference (ILD) between the first channel signal and the second channel signal.

Coherence between the first channel signal and the second channel signal can be determined based on the energy of the channel signal or the energy of the downmixed signal, the IC, the ILD, and the like, and target reverberation gain parameters that need to be encoded can be properly determined from reverberation gain parameters corresponding to all subbands of the first channel signal and the second channel signal based on the coherence between the first channel signal and the second channel signal. Therefore, bits can be saved to some extent in consideration of channel signal quality, and encoding efficiency can be improved. Further, when the coherence between the first channel signal and the second channel signal is relatively low, only reverberation gain parameters corresponding to subbands of a low frequency part of the first channel signal and the second channel signal may be encoded. When the coherence between the first channel signal and the second channel signal is relatively high, in addition to the reverberation gain parameters corresponding to the subbands of the low frequency part of the first channel signal and the second channel signal, reverberation gain parameters corresponding to subbands of a high frequency part of the first channel signal and the second channel signal may also be encoded.

With reference to the first aspect, in some implementations of the first aspect, the determining a target reverberation gain parameter that needs to be encoded in the reverberation gain parameters corresponding to the different subbands of the first channel signal and the second channel signal includes determining the target reverberation gain parameter based on at least one of coherence between energy of the first channel signal and energy of the downmixed signal and coherence between energy of the second channel signal and the energy of the downmixed signal.

Values of the energy of the first channel signal, the energy of the second channel signal, and the energy of the downmixed signal may be values obtained after normalization processing.

The coherence between both the first channel signal and the second channel signal and the downmixed signal can be conveniently measured using the energy of the channel signals, that is, the target reverberation gain parameter that needs to be encoded can be conveniently determined by comparing differences between the energy of the channel signals and the energy of the downmixed signal. Further, when a difference between energy of a channel signal and the energy of the downmixed signal is relatively large, it may be considered that coherence between the channel signal and the downmixed signal is relatively low, and in this case, only reverberation gain parameters corresponding to subbands of a low frequency part of the channel signal may be encoded.

With reference to the first aspect, in some implementations of the first aspect, each of the first channel signal and the second channel signal includes a plurality of frequency bins, and the determining the target reverberation gain parameter based on at least one of coherence between energy of the first channel signal and energy of the downmixed signal and coherence between energy of the second channel signal and the energy of the downmixed signal includes determining a first difference value between the energy of the first channel signal and the energy of the downmixed signal, where the first difference value is used to indicate a sum of absolute values of difference values between energy of the first channel signal and energy of the downmixed signal at the plurality of frequency bins, and when the first difference value is greater than a first threshold, determining that a reverberation gain parameter corresponding to a subband of a first frequency band is the target reverberation gain parameter, where the first frequency band is a part of all frequency bands of each of the first channel signal and the second channel signal.

With reference to the first aspect, in some implementations of the first aspect, each of the first channel signal and the second channel signal includes a plurality of frequency bins, and the determining the target reverberation gain parameter based on at least one of coherence between energy of the first channel signal and energy of the downmixed signal and coherence between energy of the second channel signal and the energy of the downmixed signal includes determining a second difference value between the energy of the second channel signal and the energy of the downmixed signal, where the second difference value is used to indicate a sum of absolute values of difference values between energy of the second channel signal and energy of the downmixed signal at the plurality of frequency bins, and when the second difference value is greater than a second threshold, determining that a reverberation gain parameter corresponding to a subband of a first frequency band is the target reverberation gain parameter, where the first frequency band is a part of all frequency bands of each of the first channel signal and the second channel signal.

With reference to the first aspect, in some implementations of the first aspect, each of the first channel signal and the second channel signal includes a plurality of frequency bins, and the determining the target reverberation gain parameter based on at least one of coherence between energy of the first channel signal and energy of the downmixed signal and coherence between energy of the second channel signal and the energy of the downmixed signal includes determining a first difference value between the energy of the first channel signal and the energy of the downmixed signal, where the first difference value is used to indicate a sum of absolute values of difference values between energy of the first channel signal and energy of the downmixed signal at the plurality of frequency bins, determining a second difference value between the energy of the second channel signal and the energy of the downmixed signal, where the second difference value is used to indicate a sum of absolute values of difference values between energy of the second channel signal and energy of the downmixed signal at the plurality of frequency bins, and when the first difference value is greater than a first threshold, and the second difference value is greater than a second threshold, determining that a reverberation gain parameter corresponding to a subband of a first frequency band is the target reverberation gain parameter, where the first frequency band is a part of all frequency bands of each of the first channel signal and the second channel signal.

The difference values between the energy of the first channel signal and the energy of the downmixed signal at the plurality of frequency bins and the difference values between the energy of the second channel signal and the energy of the downmixed signal at the plurality of frequency bins may be values obtained after normalization processing.

It should be understood that, when the coherence between the first channel signal or the second channel signal and the downmixed signal is relatively high, it may be considered that the first channel signal and the second channel signal are two channel signals that are relatively similar to each other (when the two channel signals are relatively similar, a mixed signal obtained by mixing the two channel signals is relatively similar to the two channel signals before mixing). When the coherence between the first channel signal or the second channel signal and the downmixed signal is relatively low, it may be considered that the first channel signal and the second channel signal are two channel signals that are relatively different from each other.

The coherence between the first channel signal and the downmixed signal is used as an example. The coherence between the first channel signal and the downmixed signal may be measured using the first difference value between the energy of the first channel signal and the energy of the downmixed signal. When the first difference value is relatively large, it may be considered that the coherence between the first channel signal and the downmixed signal is relatively low. When the first difference value is relatively small, it may be considered that the coherence between the first channel signal and the downmixed signal is relatively high.

The differences between both the energy of the first channel signal and the energy of the second channel signal and the energy of the downmixed signal can be conveniently determined by comparing the difference values between both the energy of the first channel signal and the energy of the second channel signal and the energy of the downmixed signal at the plurality of frequency bins, to further determine the target reverberation gain parameter. Therefore, it is unnecessary to compare energy of the first channel signal and energy of the second channel signal in all frequency bands.

When the energy of the first channel signal and/or the energy of the second channel signal are/is relatively different from the energy of the downmixed signal, encoding reverberation gain parameters corresponding to subbands of some frequency bands of the first channel signal and the second channel signal can not only save bits to some extent, but also improve encoding performance. However, in other approaches, reverberation gain parameters corresponding to subbands of all frequency bands of the first channel signal and the second channel signal are encoded. In this case, because the difference between the first channel signal and the second channel signal is relatively large, if the reverberation gain parameters corresponding to the subbands of all the frequency bands are still encoded, and reverberation processing is performed based on the reverberation gain parameters of all the frequency bands, finally restored first channel signal and second channel signal have relatively large distortion compared with original signals.

With reference to the first aspect, in some implementations of the first aspect, a frequency of the first frequency band is less than a frequency of another frequency band different from the first frequency band in the first channel signal and the second channel signal.

It should be understood that the first frequency band may be a low frequency band.

When the difference between the first channel signal and the second channel signal is relatively large, a difference between the two channel signals is usually relatively large at a high frequency part, but a difference between the two channel signals is relatively small at a low frequency part. However, a channel signal at the low frequency part more greatly affects human auditory experience. Therefore, when the difference between the first channel signal and the second channel signal is relatively large, only the reverberation gain parameters corresponding to the subbands of the low frequency part may be encoded. In this way, not only an encoded bit can be saved, but also auditory experience can be ensured.

With reference to the first aspect, in some implementations of the first aspect, the method further includes, when the first difference value is less than or equal to a first threshold, and the second difference value is less than or equal to a second threshold, determining reverberation gain parameters corresponding to all subbands of the first channel signal and the second channel signal as the target reverberation gain parameters.

With reference to the first aspect, in some implementations of the first aspect, when the first difference value is less than or equal to the first threshold or the second difference value is less than or equal to the second threshold, the reverberation gain parameters corresponding to all the subbands of the first channel signal and the second channel signal are determined as the target reverberation gain parameters.

When the differences between both the energy of the first channel signal and the energy of the second channel signal and the energy of the downmixed signal are relatively large, only reverberation gain parameters corresponding to some subbands may be encoded, to reduce bit overheads during encoding, and avoid signal distortion caused during reverberation processing as much as possible.

However, when the differences between both the energy of the first channel signal and the energy of the second channel signal and the energy of the downmixed signal are relatively small, signal distortion caused by reverberation processing on the channel signal is very small. To obtain a better auditory effect, the reverberation gain parameters corresponding to all the subbands may be encoded.

With reference to the first aspect, in some implementations of the first aspect, the plurality of frequency bins are in a second frequency band of each of the first channel signal and the second channel signal, and a frequency of the second frequency band is greater than a frequency of another frequency band, different from the second frequency band, in the first channel signal and the second channel signal.

The differences between both the energy of the first channel signal and the energy of the second channel signal and the energy of the downmixed signal can be conveniently determined by comparing the difference values between both the energy of the first channel signal and the energy of the second channel signal and the energy of the downmixed signal at the plurality of frequency bins of the high frequency part.

With reference to the first aspect, in some implementations of the first aspect, the determining a target reverberation gain parameter that needs to be encoded in the reverberation gain parameters corresponding to the different subbands of the first channel signal and the second channel signal includes determining energy of N subbands of the downmixed signal, determining M subbands from the N subbands, where energy of any subband in the M subbands is greater than energy of any subband in N-M subbands in the N subbands except the M subbands, both M and N are integers greater than 0, and M is less than N, and determining the target reverberation gain parameter based on a magnitude relationship between energy of the M subbands and energy of the N-M subbands.

It should be understood that when the downmixed signal is a wideband signal, the N subbands may be all subbands of the downmixed signal, and when the downmixed signal is an ultra-wideband signal, the N subbands may be subbands of the downmixed signal at a wideband part.

The coherence between the first channel signal and the second channel signal can be determined based on energy of different subbands of the downmixed signal, and further the target reverberation gain parameter that needs to be encoded is determined based on the coherence between the first channel signal and the second channel signal.

The downmixed signal may be a wideband signal or an ultra-wideband signal. When the downmixed signal is a wideband signal, the N subbands may be all subbands of the downmixed signal, and when the downmixed signal is an ultra-wideband signal, the N subbands may be subbands of the downmixed signal at a wideband part.

In addition, alternatively the M subbands may be determined based on an amplitude of each subband of the downmixed signal, that is, an amplitude of any subband in the M subbands of the downmixed signal is greater than an amplitude of any subband in the N-M subbands of the downmixed signal. A value of M may be preset.

With reference to the first aspect, in some implementations of the first aspect, the determining the target reverberation gain parameter based on a magnitude relationship between energy of the M subbands of the downmixed signal and energy of the N-M subbands of the downmixed signal includes, when an average value of the energy of the M subbands is greater than K times of an average value of the energy of the N-M subbands, determining that a reverberation gain parameter corresponding to a subband of a first frequency band of the first channel signal and the second channel signal is the target reverberation gain parameter, where K is a real number greater than zero.

With reference to the first aspect, in some implementations of the first aspect, the determining the target reverberation gain parameter based on a magnitude relationship between energy of the M subbands of the downmixed signal and energy of the N-M subbands of the downmixed signal includes, when a sum of the energy of the M subbands is greater than L times of a sum of the energy of the N-M subbands, determining that a reverberation gain parameter corresponding to a subband of a first frequency band of the first channel signal and the second channel signal is the target reverberation gain parameter, where L is a real number greater than 0.

It should be understood that K and L may have different values.

The energy of the M subbands of the downmixed signal and the energy of the N-M subbands of the downmixed signal may be compared by comparing the average value of the energy of the M subbands with the average value of the energy of the N-M subbands. To further reduce calculation complexity, the sum of the energy of the M subbands and the sum of the energy of the N-M subbands may be directly compared. In this way, a calculation process is simplified to some extent, and efficiency is improved.

When differences between the energy of the M subbands with relatively large energy and another subband with relatively small energy are relatively large, it may be considered that the difference between the first channel signal and the second channel signal is relatively large. In this case, reverberation gain parameters corresponding to subbands of some frequency bands in the first channel signal and the second channel signal may be determined as target reverberation gain parameters that need to be encoded. Further, the first frequency band may be a frequency band located at a low frequency part of the first channel signal and the second channel signal.

With reference to the first aspect, in some implementations of the first aspect, the determining a target reverberation gain parameter that needs to be encoded in the reverberation gain parameters corresponding to the different subbands of the first channel signal and the second channel signal includes determining energy of N subbands of the downmixed signal, determining M subbands from the N subbands, where energy of any subband in the M subbands is greater than energy of any subband in N-M subbands in the N subbands except the M subbands, and when an index value of a first subband in the M subbands is less than a preset index value, determining that a reverberation gain parameter corresponding to a subband of a first frequency band is the target reverberation gain parameter, where a frequency of any frequency bin in the first subband is greater than a frequency of any frequency bin in another subband in the M subbands except the first subband, and the first frequency band is a part of all frequency bands of each of the first channel signal and the second channel signal.

When an index value of a subband of a maximum frequency in the M subbands with relatively large energy is less than the preset index value, it may be considered that energy distribution of the M subbands of the downmixed signal is uneven, that is, the coherence between the first channel signal and the second channel signal is relatively small. In this case, only reverberation gain parameters corresponding to subbands of some frequency bands need to be encoded.

With reference to the first aspect, in some implementations of the first aspect, the determining a target reverberation gain parameter that needs to be encoded in the reverberation gain parameters corresponding to the different subbands of the first channel signal and the second channel signal includes determining energy of N subbands of the downmixed signal, determining J target subbands from the N subbands based on the energy of the N subbands, where energy of any subband in the J target subbands is greater than energy of another subband different from the J target subbands, both N and J are integers greater than 0, and J is less than N, and determining reverberation gain parameters corresponding to the J target subbands as target reverberation gain parameters.

A predetermined quantity of subbands are directly selected from all subbands based on energy of each subband of the downmixed signal, and reverberation gain parameters corresponding to the predetermined quantity of subbands are determined as target reverberation gain parameters, so that a reverberation gain parameter that needs to be encoded can be more flexibly selected.

With reference to the first aspect, in some implementations of the first aspect, the energy of the downmixed signal is determined based on the energy of the first channel signal and the energy of the second channel signal.

The energy of the downmixed signal is estimated or deduced based on the energy of the first channel signal and the energy of the second channel signal, which can reduce a calculation amount to some extent.

According to a second aspect, a multi-channel signal decoding method is provided, where the method includes receiving a bitstream, obtaining a downmixed signal of a first channel signal and a second channel signal in a multi-channel signal and parameter indication information based on the bitstream, where the parameter indication information is used to indicate an encoded target reverberation gain parameter in reverberation gain parameters corresponding to different subbands of the first channel signal and the second channel signal, obtaining the target reverberation gain parameter from the bitstream according to the parameter indication information, and determining the first channel signal and the second channel signal based on the downmixed signal and the target reverberation gain parameter.

In this application, the target reverberation gain parameter encoded by an encoder can be determined using the parameter indication information, and then reverberation processing is performed on a corresponding subband of the first channel signal and the second channel signal based on the target reverberation gain parameter.

According to a third aspect, a multi-channel signal encoding method is provided, where the method includes determining a downmixed signal of a first channel signal and a second channel signal in a multi-channel signal, and reverberation gain parameters corresponding to different subbands of the first channel signal and the second channel signal, determining, based on energy of N subbands of the downmixed signal, a target reverberation gain parameter that needs to be encoded in the reverberation gain parameters corresponding to the different subbands of the first channel signal and the second channel signal, where N is an integer greater than 0, and encoding the downmixed signal and the target reverberation gain parameter.

In this application, a specific quantity of subbands are directly selected from all subbands based on energy of each subband of the downmixed signal, so that a reverberation gain parameter that needs to be encoded can be more flexibly selected. In addition, compared with a manner of determining a reverberation gain parameter corresponding to a subband of a fixed frequency band as a target reverberation gain parameter, reverberation gain parameters corresponding to some subbands that may not be adjacent in frequency domain can be directly selected as target reverberation gain parameters.

With reference to the third aspect, in some implementations of the third aspect, the determining, based on energy of N subbands of the downmixed signal, a target reverberation gain parameter that needs to be encoded in the reverberation gain parameters corresponding to the different subbands of the first channel signal and the second channel signal includes determining J target subbands from the N subbands based on the energy of the N subbands, where energy of any subband in the J target subbands is greater than energy of another subband different from the J target subbands, both N and J are integers greater than 0, and J is less than N, and determining reverberation gain parameters corresponding to the J target subbands as target reverberation gain parameters.

In this application, a predetermined quantity of subbands are directly selected from all subbands based on energy of each subband of the downmixed signal, and reverberation gain parameters corresponding to the predetermined quantity of subbands are determined as target reverberation gain parameters, so that a reverberation gain parameter that needs to be encoded can be more flexibly selected.

According to a fourth aspect, a multi-channel signal decoding method is provided, where the method includes receiving a bitstream, determining a downmixed signal of a first channel signal and a second channel signal in a multi-channel signal based on the bitstream, determining, based on energy of N subbands of the downmixed signal, an encoded target reverberation gain parameter in reverberation gain parameters corresponding to different subbands of the first channel signal and the second channel signal, where N is an integer greater than 0, determining the target reverberation gain parameter based on the bitstream, and determining the first channel signal and the second channel signal based on the downmixed signal and the target reverberation gain parameter.

In this application, a decoder side can directly determine, based on energy of a plurality of subbands of the downmixed signal, the encoded target reverberation gain parameter in the reverberation gain parameters corresponding to the different subbands of the first channel signal and the second channel signal, so that bits occupied by the decoder side to transmit indication information to indicate the encoded target reverberation gain parameter are reduced, and signaling overheads can be reduced to some extent.

With reference to the fourth aspect, in some implementations of the fourth aspect, the determining, based on energy of N subbands of the downmixed signal, an encoded target reverberation gain parameter in reverberation gain parameters corresponding to different subbands of the first channel signal and the second channel signal includes determining J target subbands from the N subbands based on the energy of the N subbands, where energy of any subband in the J target subbands is greater than energy of another subband different from the J target subbands, both N and J are integers greater than 0, and J is less than N, and determining reverberation gain parameters corresponding to the J target subbands as target reverberation gain parameters.

According to a fifth aspect, an encoder is provided, and the encoder includes a module or a unit configured to perform the method in the first aspect or various implementations of the first aspect.

According to a sixth aspect, a decoder is provided, and the decoder includes a module or a unit configured to perform the method in the second aspect or various implementations of the second aspect.

According to a seventh aspect, an encoder is provided, and the encoder includes a module or a unit configured to perform the method in the third aspect or various implementations of the third aspect.

According to an eighth aspect, a decoder is provided, and the decoder includes a module or a unit configured to perform the method in the fourth aspect or various implementations of the fourth aspect.

According to a ninth aspect, an encoder is provided, including a memory and a processor, where the memory is configured to store a program, the processor is configured to execute the program, and when the program is executed, the processor performs the method in the first aspect or various implementations of the first aspect.

According to a tenth aspect, a decoder is provided, including a memory and a processor, where the memory is configured to store a program, the processor is configured to execute the program, and when the program is executed, the processor performs the method in the second aspect or various implementations of the second aspect.

According to an eleventh aspect, an encoder is provided, including a memory and a processor, where the memory is configured to store a program, the processor is configured to execute the program, and when the program is executed, the processor performs the method in the third aspect or various implementations of the third aspect.

According to a twelfth aspect, a decoder is provided, including a memory and a processor, where the memory is configured to store a program, the processor is configured to execute the program, and when the program is executed, the processor performs the method in the fourth aspect or various implementations of the fourth aspect.

According to a thirteenth aspect, a computer readable medium is provided, the computer readable medium stores program code to be executed by a device, and the program code includes an instruction used to perform the method in the first aspect or various implementations of the first aspect.

According to a fourteenth aspect, a computer readable medium is provided, the computer readable medium stores program code to be executed by a device, and the program code includes an instruction used to perform the method in the second aspect or various implementations of the second aspect.

According to a fifteenth aspect, a computer readable medium is provided, the computer readable medium stores program code to be executed by a device, and the program code includes an instruction used to perform the method in the third aspect or various implementations of the third aspect.

According to a sixteenth aspect, a computer readable medium is provided, the computer readable medium stores program code to be executed by a device, and the program code includes an instruction used to perform the method in the fourth aspect or various implementations of the fourth aspect.

DESCRIPTION OF EMBODIMENTS

The following describes technical solutions of this application with reference to accompanying drawings. To better understand a multi-channel signal encoding method and a multi-channel signal decoding method in embodiments of this application, the following first briefly describes a multi-channel signal encoding method and a multi-channel signal decoding method in other approaches with reference to FIG. 1 and FIG. 2.

Figure 1:
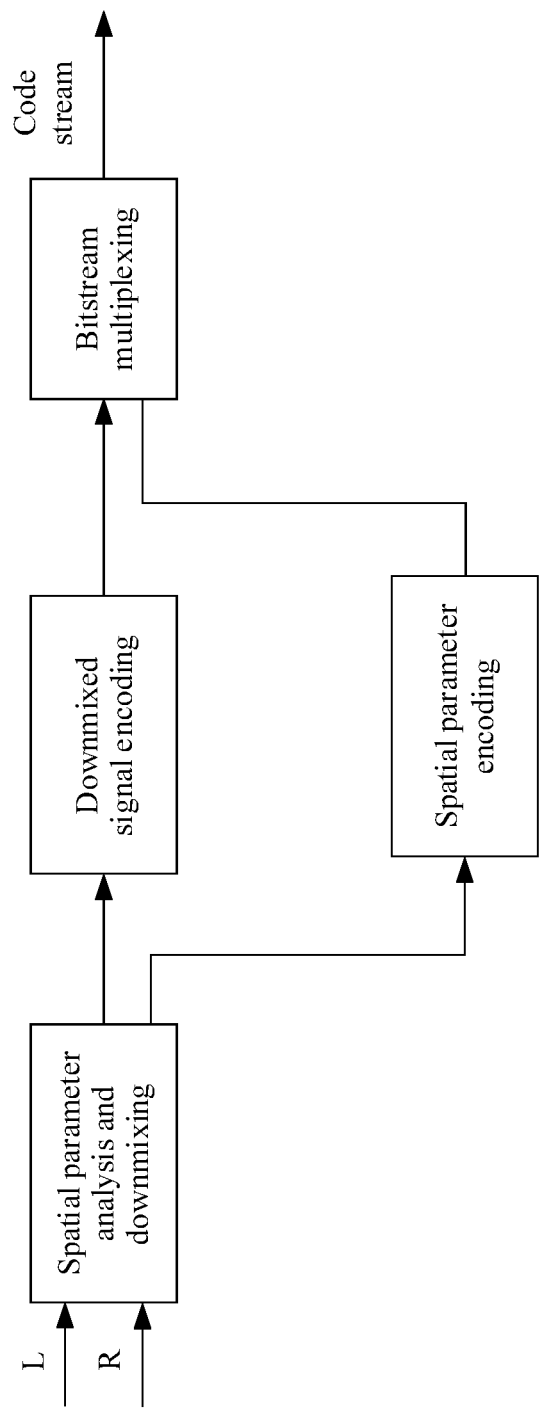
FIG. 1 is a schematic flowchart of encoding a left-channel signal and a right-channel signal in other approaches.

FIG. 1 shows a process of encoding a left-channel signal and a right-channel signal in other approaches. The encoding process shown in FIG. 1 specifically includes the following steps.

110. Perform spatial parameter analysis and downmixing processing on a left-channel signal (represented by L in the figure) and a right-channel signal (represented by R in the figure).

In an embodiment, step 110 specifically includes performing spatial parameter analysis on the left-channel signal and the right-channel signal to obtain a spatial parameter of the left-channel signal and a spatial parameter of the right-channel signal, and performing downmixing processing on the left-channel signal and the right-channel signal to obtain a downmixed signal (the downmixed signal obtained after downmixing processing is a mono audio signal, and the original two channels of audio signals are combined into one channel of audio signal by downmixing processing).

The spatial parameter (may be also referred to as a spatial sensing parameter) includes an IC, an ILD, an inter-channel time difference (ITD), an inter-channel phase difference (IPD), and the like.

The IC describes an inter-channel cross-coherence or coherence. This parameter determines sensing of a sound field range, and can improve spatial sense and sound stability of an audio signal. The ILD is used to distinguish a horizontal direction angle of a stereo source and describe an inter-channel intensity difference, and this parameter affects frequency components of an entire spectrum. The ITD and the IPD are spatial parameters representing horizontal directions of a sound source, and describe inter-channel time and phase differences. The parameters mainly affect frequency components below 2 kilohertz (kHz). For two channel signals, the ITD may represent a time delay between a left-channel signal and a right-channel signal of a stereo, and the IPD may represent a waveform similarity of the left-channel signal and the right-channel signal of the stereo after time alignment. The ILD, the ITD, and the IPD can determine human ears' sensing of a sound source location, effectively determine the sound source location, and play an important role in stereo signal restoration.

120. Encode the downmixed signal to obtain a bitstream.

130. Encode the spatial parameters to obtain a bitstream.

140. Multiplex the bitstream obtained by encoding the downmixed signal and the bitstream obtained by encoding the spatial parameters to obtain a bitstream.

The bitstream obtained through encoding may be stored or transmitted to a decoder-side device.

Figure 2:
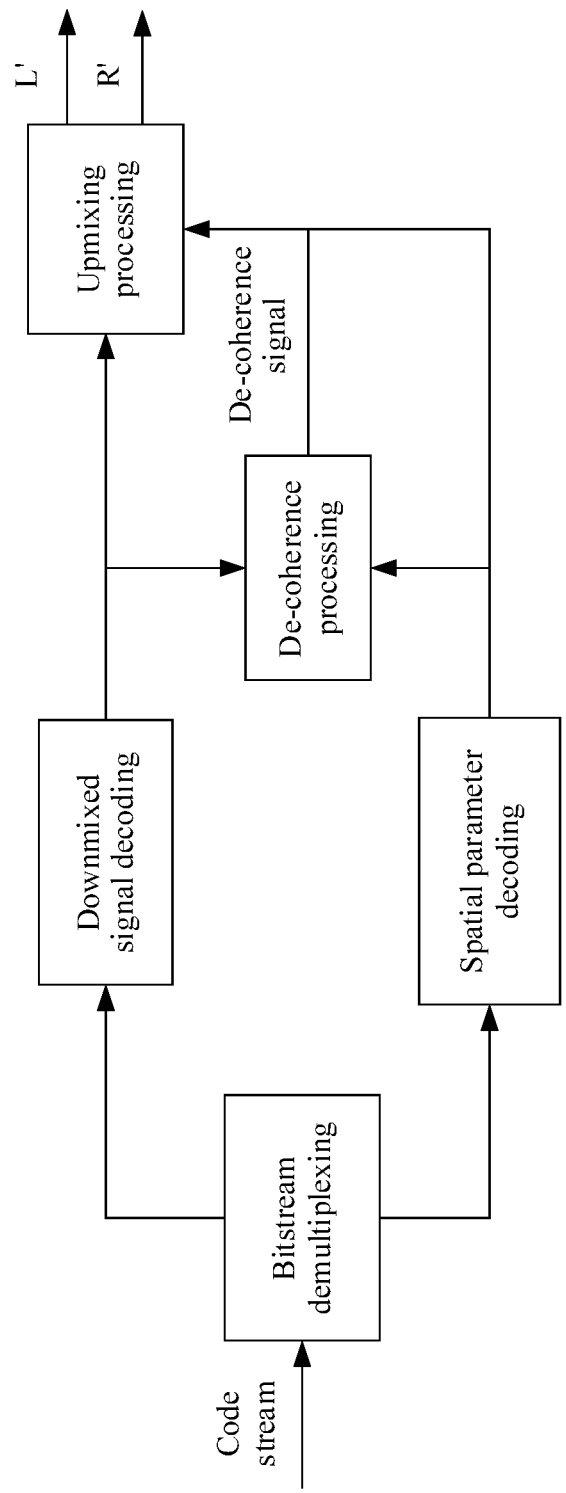
FIG. 2 is a schematic flowchart of decoding a left-channel signal and a right-channel signal in other approaches.

FIG. 2 shows a process of decoding a left-channel signal and a right-channel signal in other approaches. The decoding process shown in FIG. 2 specifically includes the following steps.

210. Demultiplex a bitstream to separately obtain a bitstream obtained by encoding a downmixed signal and a bitstream obtained by encoding a spatial parameter.

The downmixed signal and the spatial parameter are obtained through decoding based on a demultiplexed bitstream.

In step 210, a decoder side may separately decode the downmixed signal and the spatial parameter.

The spatial parameter is used to indicate an IC of the left-channel signal and the right-channel signal.

220. Obtain a de-coherence signal.

Further, the left-channel signal and the right-channel signal are obtained based on a decoded downmixed signal and the de-coherence signal of a current frame.

230. Obtain finally output left-channel signal and right-channel signal (respectively represented by L' and R' in FIG. 2) based on the spatial parameters, the left-channel signal, and the right-channel signal.

It should be understood that the left-channel signal and the right-channel signal (respectively represented by L' and R' in FIG. 2) in step 230 are obtained through decoding, and may be distorted to some extent compared with a left-channel signal and a right-channel signal that are encoded on an encoder side.

In an embodiment, the downmixed signal may be filtered, and then an IC parameter is used to correct a filtered downmixed signal to obtain a de-coherence signal.

A purpose of generating the de-coherence signal is to improve a sense of reverberation of a finally generated stereo signal on a decoder side, and increase a sound field width of the stereo signal, so that an output audio signal is more mellow and full in terms of auditory sense. The sense of reverberation is essentially an effect of delaying such as reflecting and refracting an original audio signal differently and then superimposing the reflected and refracted audio signals on the original audio signal to enter a human ear.

In other approaches, when a multi-channel signal is encoded, the multi-channel signal is usually divided into a plurality of subbands, an IC corresponding to each subband is determined, and the IC corresponding to each subband is subsequently encoded. However, encoding the IC corresponding to each subband definitely increases a quantity of bits occupied during encoding. In some cases, for example, when coherence between a plurality of channel signals is relatively low, high frequency parts of the plurality of channel signals are relatively different. In this case, if ICs corresponding to the high frequency parts of the plurality of channel signals are still encoded, and the decoder side performs reverberation processing on the high frequency parts of the plurality of channel signals based on the ICs corresponding to the high frequency parts of the plurality of channel signals, a plurality of restored channel signals are greatly distorted.

Therefore, an embodiment of this application provides a multi-channel signal encoding method, so that reverberation gain parameters of some subbands in a multi-channel signal can be adaptively selected for encoding, to effectively use bits. The following describes in detail the multi-channel signal encoding method in this embodiment of this application with reference to the accompanying drawings.

Figure 3:
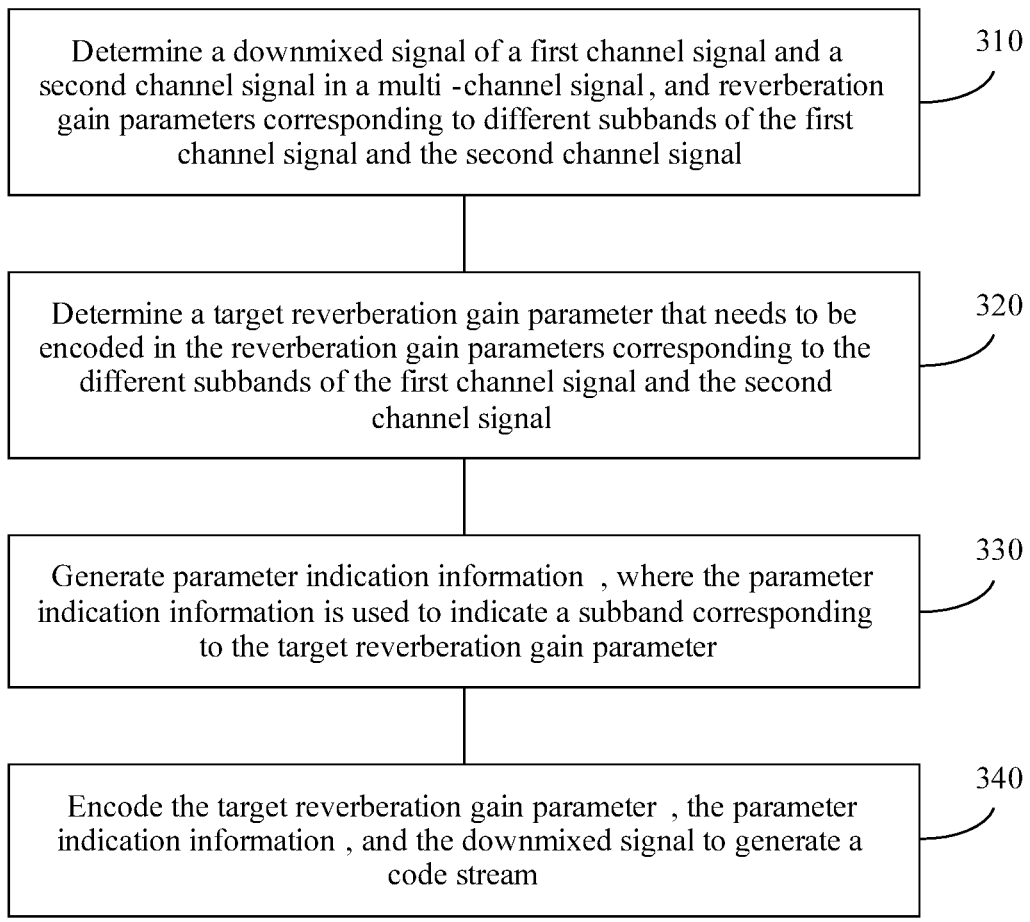
FIG. 3 is a schematic flowchart of a multi-channel signal encoding method according to an embodiment of this application.

FIG. 3 is a schematic flowchart of a multi-channel signal encoding method according to an embodiment of this application. The method in FIG. 3 may be performed by an encoder-side device or an encoder. The method in FIG. 3 includes the following steps.

310. Determine a downmixed signal of a first channel signal and a second channel signal in a multi-channel signal, and reverberation gain parameters corresponding to different subbands of the first channel signal and the second channel signal.

The multi-channel signal may be a plurality of channel signals. In addition, before step 310, the method may include obtaining the first channel signal and the second channel signal in the multi-channel signal.

This embodiment of this application sets no limitation on a sequence between a process of determining the downmixed signal and a process of determining the reverberation gain parameters corresponding to the different subbands of the first channel signal and the second channel signal. The processes may be performed simultaneously or in sequence.

In an embodiment, the downmixed signal may be obtained by performing downmixing processing on the first channel signal and the second channel signal. Spatial parameters of the first channel signal and the second channel signal are obtained by performing spatial parameter analysis on the first channel signal and the second channel signal. The spatial parameters include the reverberation gain parameters corresponding to the different subbands of the first channel signal and the second channel signal, and other spatial parameters such as an IC, an ILD, an ITD, and an IPD.

It should be understood that the first channel signal and the second channel signal correspond to a same spatial parameter, and further, the first channel signal and the second channel signal are also corresponding to a same initial reverberation gain parameter. That is, a spatial parameter of the first channel signal and a spatial parameter of the second channel signal are the same, and an initial reverberation gain parameter of the first channel signal and an initial reverberation gain parameter of the second channel signal are the same.

Further, assuming that each of the first channel signal and the second channel signal includes 10 subbands, and each subband corresponds to one reverberation gain parameter, reverberation gain parameters corresponding to subbands, whose index values are the same, of the first channel signal and the second channel signal are the same.

In addition, the first channel signal, the second channel signal, and the downmixed signal may be channel signals obtained after normalization processing.

320. Determine a target reverberation gain parameter that needs to be encoded in the reverberation gain parameters corresponding to the different subbands of the first channel signal and the second channel signal.

330. Generate parameter indication information, where the parameter indication information is used to indicate a subband corresponding to the target reverberation gain parameter.

The parameter indication information may indicate, using a flag bit, the subband corresponding to the target reverberation gain parameter. For example, each of the first channel signal and the second channel signal includes 10 subbands (index numbers of the subbands are 0 to 9), the parameter indication information includes 10 flag bits, and the 10 flag bits are successively corresponding to the 10 subbands of each of the first channel signal and the second channel signal. When a flag bit corresponding to a subband is 1, a reverberation gain parameter corresponding to the subband is a target reverberation gain parameter that needs to be encoded. However, if a flag bit corresponding to a subband is 0, a reverberation gain parameter corresponding to the subband is not a target reverberation gain parameter. In this way, when performing encoding, an encoder side encodes only a reverberation gain parameter corresponding to a subband whose flag bit is 1.

Alternatively, the parameter indication information needs to include only one flag bit, and the flag bit is 1 or 0. When the flag bit is 1, it indicates that a reverberation gain parameter of a selected target subband is to be encoded. When the flag bit is 0, it indicates that reverberation gain parameters of all subbands are to be encoded.

In an embodiment, index numbers of all subbands of the first channel signal and the second channel signal are 0 to 9, and subbands whose index numbers are 0 to 5 are target subbands. In this case, when the flag bit of the parameter indication information is 1, reverberation gain parameters of the subbands whose index numbers are 0 to 5 are to be encoded. When the flag bit of the parameter indication information is 0, reverberation gain parameters of the subbands whose index numbers are 0 to 9 are to be encoded.

340. Encode the target reverberation gain parameter, the parameter indication information, and the downmixed signal to generate a bitstream.

In this application, when the first channel signal and the second channel signal are being encoded, reverberation gain parameters corresponding to only some subbands of the first channel signal and the second channel signal may be encoded. Compared with a manner in other approaches in which reverberation gain parameters corresponding to all subbands of the first channel signal and the second channel signal need to be encoded, bit overheads can be reduced to some extent, and encoding efficiency can be improved.

In an embodiment, a quantity of saved bits may be used to encode another parameter or allocate more bits to the downmixed signal if reverberation gain parameters corresponding to some subbands are encoded, thereby improving overall encoding performance.

For example, reverberation gain parameters corresponding to subbands of a low frequency part of the first channel signal and the second channel signal may be selected as target reverberation gain parameters that need to be encoded, and reverberation gain parameters corresponding to subbands of a high frequency part of the first channel signal and the second channel signal are not to be encoded.

Optionally, when the reverberation gain parameters corresponding to the different subbands of the first channel signal and the second channel signal are being generated, the reverberation gain parameters corresponding to all the subbands of the first channel signal and the second channel signal may be generated, that is, all reverberation gain parameters of the first channel signal and the second channel signal are generated, and then only the target reverberation gain parameter in all the reverberation gain parameters is encoded during encoding.

Alternatively, to further improve encoding efficiency, when spatial parameter analysis is performed on the first channel signal and the second channel signal, only the target reverberation gain parameter may be generated, but a remaining reverberation gain parameter not to be encoded is not generated. Further, if the target reverberation gain parameter corresponds to a target subband of the first channel signal and the second channel signal, when spatial parameter analysis is performed on the first channel signal and the second channel signal, only a reverberation gain parameter corresponding to the target subband of the first channel signal and the second channel signal may be determined, and a reverberation gain parameter corresponding to another subband of the first channel signal and the second channel signal does not need to be determined. In this way, encoding efficiency can be further improved.

Optionally, in an embodiment, the determining a target reverberation gain parameter that needs to be encoded in the reverberation gain parameters corresponding to the different subbands of the first channel signal and the second channel signal includes determining the target reverberation gain parameter based on at least one of energy of the first channel signal and energy of the second channel signal, an IC between the first channel signal and the second channel signal, magnitude of energy of different subbands of the downmixed signal, and an ILD between the first channel signal and the second channel signal.

In an embodiment, coherence between the first channel signal and the second channel signal can be determined based on the energy of the first channel signal and the energy of the second channel signal or the energy of the downmixed signal, the IC between the first channel signal and the second channel signal, and the ILD between the first channel signal and the second channel signal. In addition, target reverberation gain parameters that need to be encoded are properly determined based on the coherence between the first channel signal and the second channel signal from the reverberation gain parameters corresponding to all the subbands of the first channel signal and the second channel signal, so that bits can be saved to some extent and encoding efficiency can be improved.

For example, when the coherence between the first channel signal and the second channel signal is relatively low, only the reverberation gain parameters corresponding to the subbands of the low frequency part of the first channel signal and the second channel signal may be encoded. When the coherence between the first channel signal and the second channel signal is relatively high, in addition to the reverberation gain parameters corresponding to the subbands of the low frequency part of the first channel signal and the second channel signal, the reverberation gain parameters corresponding to the subbands of the high frequency part of the first channel signal and the second channel signal may also be encoded. That is, when the coherence between the first channel signal and the second channel signal is relatively high, the reverberation gain parameters corresponding to all the subbands of the first channel signal and the second channel signal may be encoded.

When the target reverberation gain parameter is determined based on the IC between the first channel signal and the second channel signal, a size of an IC value between the first channel signal and the second channel signal may be determined, and the coherence between the first channel signal and the second channel signal is determined based on the size of the IC value. For example, when the IC value between the first channel signal and the second channel signal is relatively small (in this case, it may be considered that the coherence between the first channel signal and the second channel signal is relatively low), the reverberation gain parameters corresponding to the subbands of the low frequency part of the first channel signal and the second channel signal may be determined as target reverberation gain parameters. When the IC value between the first channel signal and the second channel signal is relatively large (in this case, it may be considered that the coherence between the first channel signal and the second channel signal is relatively high), the reverberation gain parameters corresponding to the subbands of the low frequency part and the subbands of the high frequency part of the first channel signal and the second channel signal (or the subbands of all frequency bands of the first channel signal and the second channel signal) may be determined as target reverberation gain parameters.

Optionally, in an embodiment, the determining a target reverberation gain parameter that needs to be encoded in the reverberation gain parameters corresponding to the different subbands of the first channel signal and the second channel signal includes determining the target reverberation gain parameter based on at least one of coherence between energy of the first channel signal and energy of the downmixed signal and coherence between energy of the second channel signal and the energy of the downmixed signal.

That is, when the target reverberation gain parameter is being determined, the target reverberation gain parameter may be separately determined based on the coherence between the energy of the first channel signal and the energy of the downmixed signal or the coherence between the energy of the second channel signal and the energy of the downmixed signal, or the target reverberation gain parameter may be jointly determined based on the coherence between the energy of the first channel signal and the energy of the downmixed signal and the coherence between the energy of the second channel signal and the energy of the downmixed signal.

In an embodiment, each of the first channel signal and the second channel signal includes a plurality of frequency bins, and the determining the target reverberation gain parameter based on at least one of coherence between energy of the first channel signal and energy of the downmixed signal and coherence between energy of the second channel signal and the energy of the downmixed signal includes determining a first difference value between the energy of the first channel signal and the energy of the downmixed signal, where the first difference value is used to indicate a sum of absolute values of difference values between energy of the first channel signal and energy of the downmixed signal at the plurality of frequency bins, and when the first difference value is greater than a first threshold, determining that a reverberation gain parameter corresponding to a subband of a first frequency band is the target reverberation gain parameter, where the first frequency band is a part of all frequency bands of each of the first channel signal and the second channel signal.

In other embodiments, each of the first channel signal and the second channel signal includes a plurality of frequency bins, and the determining the target reverberation gain parameter based on at least one of coherence between energy of the first channel signal and energy of the downmixed signal and coherence between energy of the second channel signal and the energy of the downmixed signal includes determining a second difference value between the energy of the second channel signal and the energy of the downmixed signal, where the second difference value is used to indicate a sum of absolute values of difference values between energy of the second channel signal and energy of the downmixed signal at the plurality of frequency bins, and when the second difference value is greater than a second threshold, determining that a reverberation gain parameter corresponding to a subband of a first frequency band is the target reverberation gain parameter, where the first frequency band is a part of all frequency bands of each of the first channel signal and the second channel signal.

In other embodiments, each of the first channel signal and the second channel signal includes a plurality of frequency bins, and the determining the target reverberation gain parameter based on at least one of coherence between energy of the first channel signal and energy of the downmixed signal and coherence between energy of the second channel signal and the energy of the downmixed signal includes determining a first difference value between the energy of the first channel signal and the energy of the downmixed signal, where the first difference value is used to indicate a sum of absolute values of difference values between energy of the first channel signal and energy of the downmixed signal at the plurality of frequency bins, determining a second difference value between the energy of the second channel signal and the energy of the downmixed signal, where the second difference value is used to indicate a sum of absolute values of difference values between energy of the second channel signal and energy of the downmixed signal at the plurality of frequency bins, and when the first difference value is greater than a first threshold, and the second difference value is greater than a second threshold, determining that a reverberation gain parameter corresponding to a subband of a first frequency band is the target reverberation gain parameter, where the first frequency band is a part of all frequency bands of each of the first channel signal and the second channel signal.

The difference values between the energy of the first channel signal and the energy of the downmixed signal at the plurality of frequency bins and the difference values between the energy of the second channel signal and the energy of the downmixed signal at the plurality of frequency bins may be values obtained after normalization processing.

The first threshold and the second threshold may be preset. In addition, the first threshold and the second threshold may be the same or different.

The coherence between both the first channel signal and the second channel signal and the downmixed signal can be conveniently measured based on the energy of the channel signals, that is, the target reverberation gain parameter that needs to be encoded can be conveniently determined by comparing the differences between the energy of the channel signals and the energy of the downmixed signal.

For example, when the difference between the energy of the first channel signal and the energy of the downmixed signal is relatively large, it may be considered that the coherence between the first channel signal and the downmixed signal is relatively low, and in this case, only the reverberation gain parameters corresponding to the subbands of the low frequency part of the first channel signal may be encoded.

It should be understood that, when the coherence between the first channel signal or the second channel signal and the downmixed signal is relatively high, it may be considered that the first channel signal and the second channel signal are two channel signals that are relatively similar to each other (when the two channel signals are relatively similar, a mixed signal obtained by mixing the two channel signals is relatively similar to the two channel signals before mixing). When the coherence between the first channel signal or the second channel signal and the downmixed signal is relatively low, it may be considered that the first channel signal and the second channel signal are two channel signals that are relatively different from each other.

The coherence between the first channel signal and the downmixed signal is used as an example. The coherence between the first channel signal and the downmixed signal may be measured using the first difference value between the energy of the first channel signal and the energy of the downmixed signal. When the first difference value is relatively large, it may be considered that the coherence between the first channel signal and the downmixed signal is relatively low. When the first difference value is relatively small, it may be considered that the coherence between the first channel signal and the downmixed signal is relatively high.

When at least one of the first difference value and the second difference value exceeds the corresponding threshold, it may be considered that the coherence between the first channel signal and the second channel signal is relatively low. In this case, reverberation gain parameters corresponding to subbands of some frequency bands of the first channel signal and the second channel signal are encoded, which can not only save bits to some extent, but also improve encoding performance. However, in this case, in other approaches, the reverberation gain parameters corresponding to the subbands of all the frequency bands of the first channel signal and the second channel signal are still encoded. In this case, because the difference between the first channel signal and the second channel signal is relatively large, if the reverberation gain parameters corresponding to the subbands of all the frequency bands are still encoded, and reverberation processing is performed based on the reverberation gain parameters of all the frequency bands, finally restored first channel signal and second channel signal have relatively large distortion compared with original signals.

Certainly, alternatively, only when both the first difference value and the second difference value are greater than the corresponding thresholds, the reverberation gain parameter corresponding to the subband of the first frequency band of the first channel signal and the second channel signal can be determined as the target reverberation gain parameter.

A frequency of the first frequency band may be less than a frequency of another frequency band different from the first frequency band in the first channel signal and the second channel signal. Further, the first frequency band may be a frequency band with a lowest frequency in the first channel signal and the second channel signal. That is, a reverberation gain parameter corresponding to a subband of a lowest frequency band in the first channel signal and the second channel signal may be determined as the target reverberation gain parameter.

Alternatively, the first frequency band may be a frequency band of an intermediate frequency value in the first channel signal and the second channel signal (frequencies of a part of all the frequency bands of the first channel signal and the second channel signal are greater than a frequency of the first frequency band, and frequencies of another part of all the frequency bands are less than the frequency of the first frequency band), that is, a reverberation gain parameter corresponding to a subband of the intermediate frequency value of the first channel signal and the second channel signal may be determined as the target reverberation gain parameter.

Optionally, the plurality of frequency bins are in a second frequency band of each of the first channel signal and the second channel signal, and a frequency of the second frequency band is greater than a frequency of another frequency band, different from the second frequency band, in the first channel signal and the second channel signal.

That is, the plurality of frequency bins are located in the second frequency band with a relatively high frequency. Therefore, the difference values between both the energy of the first channel signal and the energy of the second channel signal and the energy of the downmixed signal can be conveniently determined by comparing the differences between both the energy of the first channel signal and the energy of the second channel signal and the energy of the downmixed signal at the plurality of frequency bins at the high frequency part. Therefore, it is unnecessary to compare differences between both energy of the first channel signal and energy of the second channel signal and energy of the downmixed signal in the entire frequency band, thereby simplifying a calculation process.

The difference values between both the energy of the first channel signal and the energy of the second channel signal and the energy of the downmixed signal can be conveniently determined by comparing the differences between both the energy of the first channel signal and the energy of the second channel signal and the energy of the downmixed signal at the plurality of frequency bins. Further, the target reverberation gain parameter is determined based on the difference values between both the energy of the first channel signal and the energy of the second channel signal and the energy of the downmixed signal, and it is unnecessary to compare differences between both energy of the first channel signal and energy of the second channel signal and energy of the downmixed signal in all frequency bands.

Optionally, in an embodiment, the method in FIG. 3 further includes, when the first difference value is less than or equal to the first threshold, and the second difference value is less than or equal to the second threshold, determining the reverberation gain parameters corresponding to all the subbands of the first channel signal and the second channel signal as the target reverberation gain parameters.

When the first difference value is less than or equal to the first threshold, and the second difference value is less than or equal to the second threshold, the differences between both the energy of the first channel signal and the energy of the second channel signal and the energy of the downmixed signal are relatively small. In this case, it may be considered that the coherence between the first channel signal and the second channel signal is relatively large. To improve sense of reverberation of an output channel signal, the reverberation gain parameters corresponding to all the subbands may be encoded.

When the differences between both the energy of the first channel signal and the energy of the second channel signal and the energy of the downmixed signal are relatively large, only reverberation gain parameters corresponding to some subbands may be encoded, to reduce bit overheads during encoding, and avoid signal distortion caused during reverberation processing as much as possible. When the differences between both the energy of the first channel signal and the energy of the second channel signal and the energy of the downmixed signal are relatively small, signal distortion caused by reverberation processing on the channel signal is very small. To obtain a better auditory effect, the reverberation gain parameters corresponding to all the subbands may be encoded.

In an embodiment, when the first channel signal is a left-channel signal and the second channel signal is a right-channel signal, the first difference value and the second difference value may be calculated based on the following formulas.

$$\text{diff\_l\_h} = \sum_{k=M1}^{M2} |\text{mag\_l}[k] - \text{mag\_dmx}[k]| \quad (1)$$

$$\text{diff\_r\_h} = \sum_{k=M1}^{M2} |\text{mag\_r}[k] - \text{mag\_dmx}[k]| \quad (2)$$

diff_l_h is the first difference value, diff_r_h is the second difference value, a frequency band of each of the left-channel signal and the right-channel signal includes a high frequency part and a low frequency part, M1 is a start frequency bin of the high frequency part, M2 is an end frequency bin of the high frequency part, mag_l[k] is energy or an amplitude value of the left-channel signal at a frequency bin with an index k between M1 and M2, mag_r[k] is energy or an amplitude value of the right-channel signal at the frequency bin with an index k between M1 and M2, mag_dmx[k] energy or an amplitude value of the downmixed signal at the frequency bin with an index k between M1 and M2, and mag_dmx[k] may be calculated using the downmixed signal itself, or may be calculated based on the energy or the amplitude values of the left-channel signal and the right-channel signal.

After the first difference value and the second difference value are calculated based on Formulas (1) and (2), inter-frame smoothing processing may be further performed on the first difference value and the second difference value (smoothing processing may be performed on the first difference value, the second difference value, and difference values calculated in a previous frame), and then the target reverberation gain parameter is determined using relationships between both the first difference value and the second difference value obtained through smoothing processing and preset thresholds.

Optionally, in an embodiment, the determining a target reverberation gain parameter that needs to be encoded in the reverberation gain parameters corresponding to the different subbands of the first channel signal and the second channel signal includes determining energy of N subbands of the downmixed signal, determining M subbands from the N subbands, where energy of any subband in the M subbands is greater than energy of any subband in N-M subbands in the N subbands except the M subbands, both M and N are integers greater than 0, and M is less than N, and determining the target reverberation gain parameter based on a magnitude relationship between energy of the M subbands and energy of the N-M subbands.

The coherence between the first channel signal and the second channel signal can be determined based on energy of different subbands of the downmixed signal, and further the target reverberation gain parameter that needs to be encoded is determined based on the coherence between the first channel signal and the second channel signal.

In an embodiment, the determining the target reverberation gain parameter based on a magnitude relationship between energy of the M subbands of the downmixed signal and energy of the N-M subbands of the downmixed signal includes, when a sum of the energy of the M subbands is greater than K times of a sum of the energy of the N-M subbands, determining that a reverberation gain parameter corresponding to a subband of a first frequency band of the first channel signal and the second channel signal is the target reverberation gain parameter, where K is a real number greater than 0.

The determining the target reverberation gain parameter based on a magnitude relationship between energy of the M subbands of the downmixed signal and energy of the N-M subbands of the downmixed signal includes, when an average value of the energy of the M subbands is greater than L times of an average value of the energy of the N-M subbands, determining that a reverberation gain parameter corresponding to a subband of a first frequency band of the first channel signal and the second channel signal is the target reverberation gain parameter, where L is a real number greater than 0.

It should be understood that K and L may have different values. More specifically, when M is greater than N-M, K may be less than L, and when M is less than N-M, K may be greater than L.

The energy of the N subbands of the downmixed signal and the energy of the N-M subbands of the downmixed signal may be compared by comparing the average value of the energy of the M subbands of the downmixed signal with the average value of the energy of the N-M subbands of the downmixed signal. To further reduce calculation complexity, the sum of the energy of the M subbands of the downmixed signal and the sum of the energy of the N-M subbands of the downmixed signal may be directly compared. In this way, a calculation process is simplified to some extent, and efficiency is improved.

When differences between the energy of the M subbands, of the downmixed signal, with relatively large energy and another subband with relatively small energy are relatively large, it may be considered that the difference between the first channel signal and the second channel signal is relatively large. In this case, reverberation gain parameters corresponding to subbands of some frequency bands in the first channel signal and the second channel signal may be determined as target reverberation gain parameters that need to be encoded. Further, the first frequency band may be a frequency band at the low frequency part of the first channel signal and the second channel signal, or may be a frequency band at an intermediate frequency part of the first channel signal and the second channel signal.

Optionally, in an embodiment, the determining a target reverberation gain parameter that needs to be encoded in the reverberation gain parameters corresponding to the different subbands of the first channel signal and the second channel signal includes determining energy of N subbands of the downmixed signal, determining M subbands from the N subbands, where energy of any subband in the M subbands is greater than energy of any subband in N-M subbands in the N subbands except the M subbands, and when an index value of a first subband in the M subbands is less than a preset index value, determining that a reverberation gain parameter corresponding to a subband of a first frequency band of the first channel signal and the second channel signal is the target reverberation gain parameter, where a frequency of any frequency bin of the first subband is greater than a frequency of any frequency bin of another subband in the M subbands except the first subband, and the first frequency band is a part of all frequency bands of each of the first channel signal and the second channel signal.

When an index value of a subband of a maximum frequency in the M subbands with relatively large energy is less than the preset index value, it may be considered that energy distribution of the M subbands of the downmixed signal is uneven, that is, the coherence between the first channel signal and the second channel signal is relatively small. In this case, only reverberation gain parameters corresponding to subbands of some frequency bands need to be encoded.

The downmixed signal may be a wideband signal or an ultra-wideband signal. When the downmixed signal is a wideband signal, the N subbands may be all subbands of the downmixed signal, and when the downmixed signal is an ultra-wideband signal, the N subbands may be subbands of the downmixed signal at a wideband part.

The M subbands may be determined from the N subbands based on an amplitude of each subband of the downmixed signal in addition to magnitude of the energy of each subband of the downmixed signal. Further, the M subbands may be determined based on the amplitude of each subband of the downmixed signal, so that an amplitude of any subband in the M subbands is greater than an amplitude of any subband in the N-M subbands.

A value of M may be a value preset before encoding. For example, the downmixed signal includes a total of 10 subbands. In this case, four subbands with maximum energy or amplitudes may be selected. When the energy or the amplitude values of the four subbands of the downmixed signal (which may be a sum of energy or amplitude values, or may be an average value of energy or amplitude values) are greater than a predetermined multiple of energy or amplitude values of the remaining six subbands of the downmixed signal, it is determined that the reverberation gain parameter corresponding to the first frequency band of the first channel signal and the second channel signal is the target reverberation gain parameter.

It should be understood that, in this embodiment of this application, the target reverberation gain parameter may be determined based on at least one of the following conditions. When at least one of the following conditions is valid, some reverberation gain parameters may be determined as target reverberation gain parameters.

Condition 1. A difference value or difference values between the energy of the first channel signal and/or the energy of the second channel signal and the energy of the downmixed signal is/are greater than a preset threshold/preset thresholds.

Condition 2. The energy of the M subbands of the downmixed signal is greater than a predetermined multiple of the energy of the N-M subbands of the downmixed signal.

Condition 3. The index value of the first subband in the M subbands is greater than the preset index value.

A frequency of any spectral coefficient in the first subband is greater than a frequency of any spectral coefficient of another subband in the M subbands except the first subband.

Optionally, in an embodiment, the determining a target reverberation gain parameter that needs to be encoded in the reverberation gain parameters corresponding to the different subbands of the first channel signal and the second channel signal includes determining energy of N subbands of the downmixed signal, determining J target subbands from the N subbands based on the energy of the N subbands, where energy of any subband in the J target subbands is greater than energy of another subband different from the J target subbands, both N and J are integers greater than 0, and J is less than N, and determining reverberation gain parameters corresponding to the J target subbands as target reverberation gain parameters. J may be a preset predetermined quantity.

A predetermined quantity of subbands are directly selected from all subbands based on energy of each subband of the downmixed signal, and reverberation gain parameters corresponding to the predetermined quantity of subbands are determined as target reverberation gain parameters, so that a reverberation gain parameter that needs to be encoded can be more flexibly selected.

Compared with a manner of determining a reverberation gain parameter corresponding to a subband of a fixed frequency band as a target reverberation gain parameter, reverberation gain parameters corresponding to some subbands that may not be adjacent in frequency domain can be directly and flexibly selected as target reverberation gain parameters.

Optionally, in an embodiment, the energy of the downmixed signal is determined based on the energy of the first channel signal and the energy of the second channel signal. The energy of the downmixed signal may be calculated based on the downmixed signal itself, or may be estimated or deduced using the energy of the first channel signal and the energy of the second channel signal. When the energy of the downmixed signal is determined using the energy of the first channel signal and the energy of the second channel signal, a calculation process can be simplified to some extent.

Figure 4:
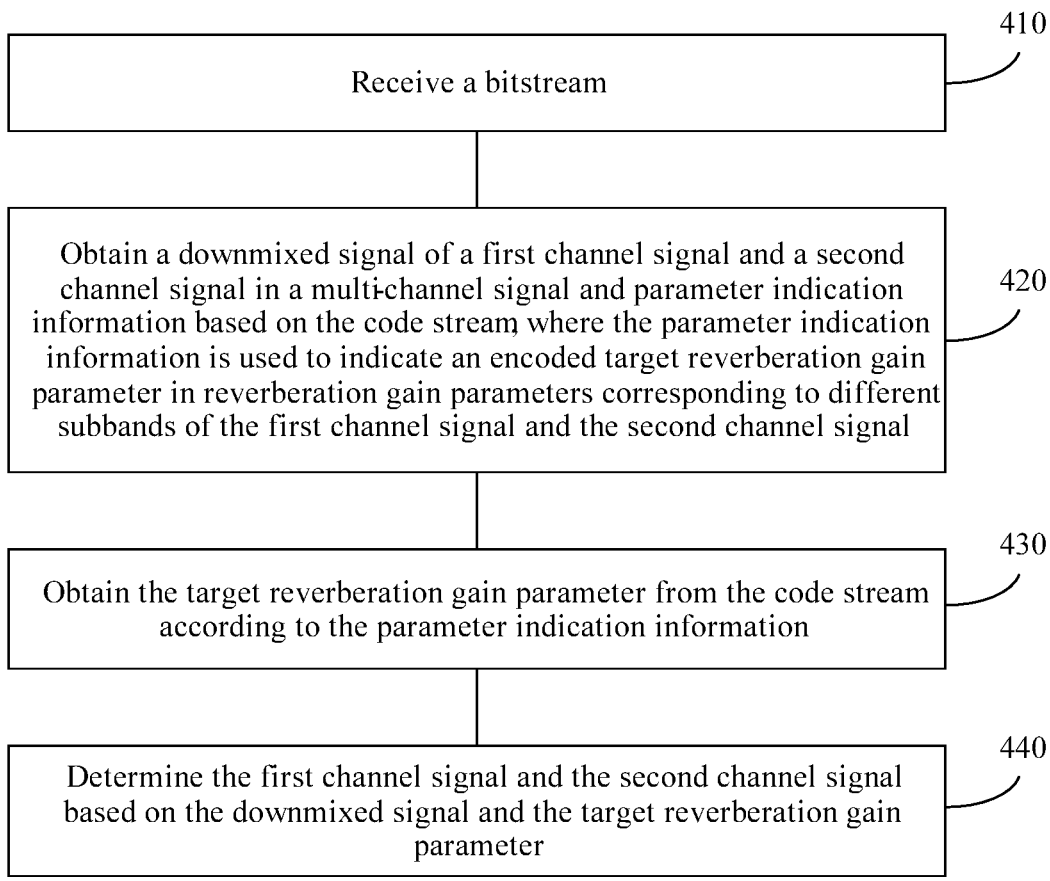
FIG. 4 is a schematic flowchart of a multi-channel signal decoding method according to an embodiment of this application.

FIG. 4 is a schematic flowchart of a multi-channel signal decoding method according to an embodiment of this application. The method in FIG. 4 may be performed by a decoder-side device or a decoder. The decoding method in FIG. 4 corresponds to the encoding method in FIG. 3. The decoding method in FIG. 4 may be used to decode the bitstream obtained by encoding the first channel signal and the second channel signal in the encoding method in FIG. 3. The method in FIG. 4 includes the following steps.

410. Receive a bitstream.

420. Obtain a downmixed signal of a first channel signal and a second channel signal in a multi-channel signal and parameter indication information based on the bitstream, where the parameter indication information is used to indicate an encoded target reverberation gain parameter in reverberation gain parameters corresponding to different subbands of the first channel signal and the second channel signal.

The parameter indication information may indicate, using a flag bit, a subband corresponding to the target reverberation gain parameter. For example, each of the first channel signal and the second channel signal includes 10 subbands (subbands whose index numbers are 0 to 9), the parameter indication information includes 10 flag bits, and the 10 flag bits are successively corresponding to the 10 subbands of each of the multi-channel signal. When a flag bit corresponding to a subband is 1, a reverberation gain parameter corresponding to the subband is a target reverberation gain parameter that needs to be encoded. If a flag bit corresponding to a subband is 0, a reverberation gain parameter corresponding to the subband is not a target reverberation gain parameter. Further, if flag bits corresponding to the subbands whose index numbers are 0 to 5 are 1, and flag bits corresponding to the subbands whose index numbers are 6 to 9 are 0, a decoder side decodes only reverberation gain parameters corresponding to the subbands whose index numbers are 1 to 5 during decoding.

430. Obtain the target reverberation gain parameter from the bitstream according to the parameter indication information.

440. Determine the first channel signal and the second channel signal based on the downmixed signal and the target reverberation gain parameter.

In this application, the target reverberation gain parameter encoded by an encoder can be determined using the parameter indication information, and then reverberation processing is performed on a corresponding subband of the first channel signal and the second channel signal based on the target reverberation gain parameter.

It should be understood that, before reverberation processing is performed on the first channel signal and the second channel signal based on the target reverberation gain parameter, the decoder side further obtains a de-coherence signal, and corrects the de-coherence signal using the target reverberation gain parameter. Then, reverberation processing may be further performed on the first channel signal and the second channel signal using the corrected de-coherence signal. If each of the first channel signal and the second channel signal includes 10 subbands (subbands whose index numbers are 0 to 9), and reverberation gain parameters corresponding to the subbands whose index numbers are 0 to 5 are target reverberation gain parameters, the decoder side obtains only the reverberation gain parameters corresponding to the subbands whose index numbers are 0 to 5, and does not obtain reverberation gain parameters corresponding to the subbands whose index numbers are 6 to 10. Therefore, the decoder side performs reverberation processing only on the subbands whose index numbers are 0 to 5 of the first channel signal and the second channel signal, and does not perform reverberation processing on the subbands whose index numbers are 6 to 10 of the first channel signal and the second channel signal.

When the first channel signal and the second channel signal include a left-channel signal and a right-channel signal, the determining the first channel signal and the second channel signal based on the downmixed signal and the target reverberation gain parameter includes determining a de-coherence signal based on a downmixed signal and a target reverberation gain parameter of a frame previous to a current frame, and determining the left-channel signal and the right-channel signal based on the de-coherence signal and a downmixed signal of the current frame.

For example, the first channel signal and the second channel signal include a left-channel signal and a right-channel signal. The downmixed signal of the current frame is dmx, the downmixed signal of the frame previous to the current frame is dmx_pred, and a target downmixed gain parameter is gain. Then, a de-coherence signal tmp is first obtained based on dmx_pred and gain. Then, the left-channel signal L=dmx+tmp and the right-channel signal R=dmx−tmp are obtained based on the downmixed signal of the current frame and the de-coherence signal.

Figure 5:
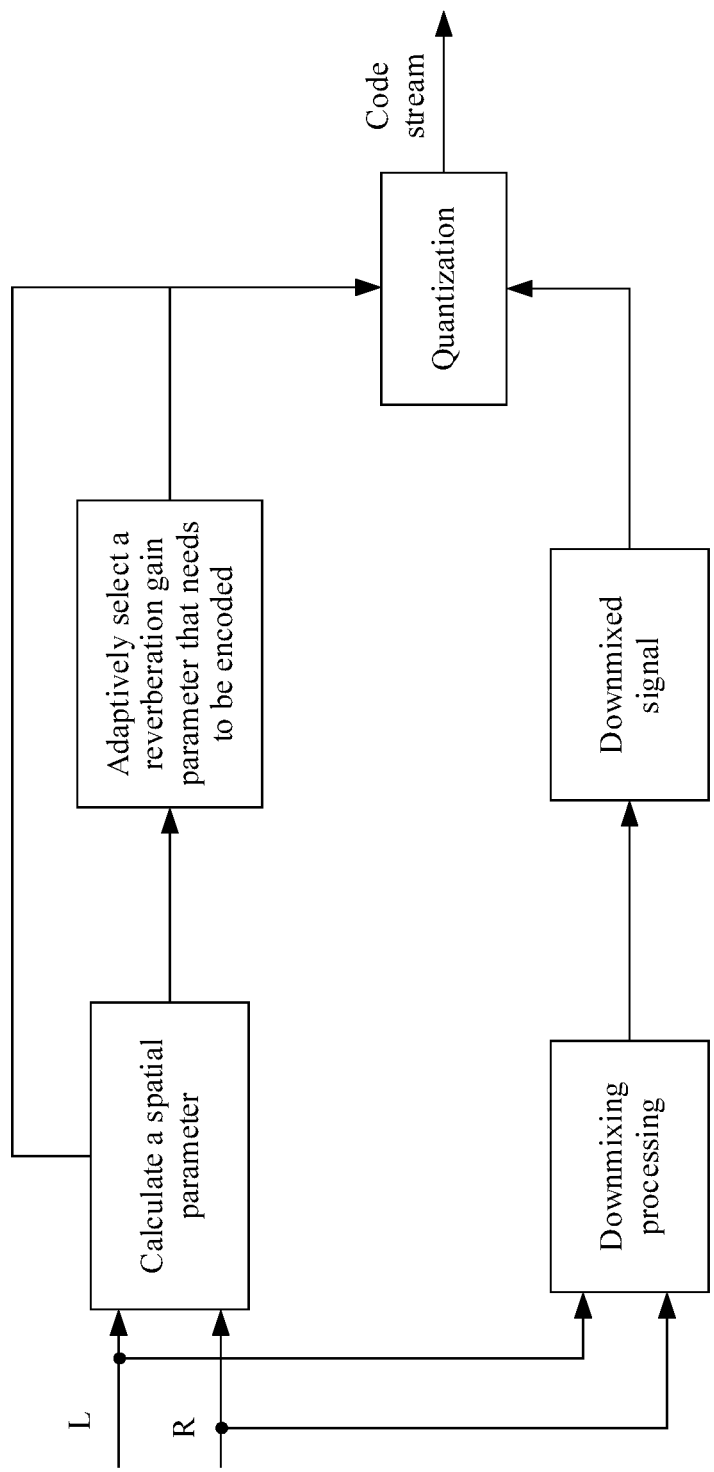
FIG. 5 is a schematic flowchart of a multi-channel signal encoding method according to an embodiment of this application.
Figure 6:
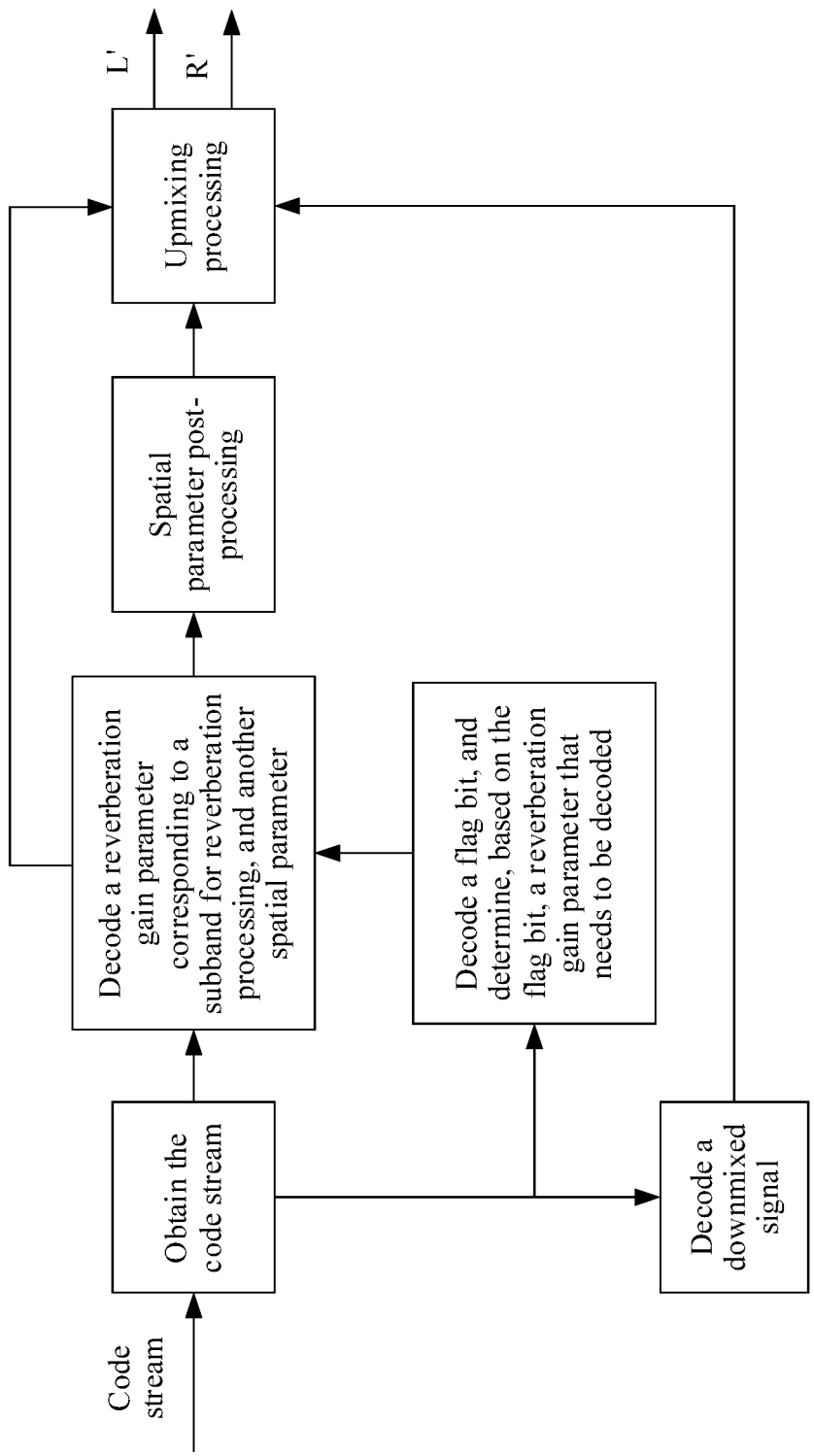
FIG. 6 is a schematic flowchart of a multi-channel signal decoding method according to an embodiment of this application.

With reference to FIG. 5 and FIG. 6, the following describes in detail an entire process of the multi-channel signal encoding method and decoding method in the embodiments of this application using an example of a left-channel signal and a right-channel signal.

FIG. 5 is a schematic flowchart of a multi-channel signal encoding method according to an embodiment of this application. In FIG. 5, a multi-channel signal includes a left-channel signal and a right-channel signal, and a process of encoding the left-channel signal and the right-channel signal specifically includes the following steps.

510. Calculate a spatial parameter of the left-channel signal and a spatial parameter of the right-channel signal.

The spatial parameters include reverberation gain parameters corresponding to subbands of the left-channel signal and the right-channel signal, and other spatial parameters (such as an IC, an ILD, an ITD, and an IPD).

520. Perform downmixing processing on the left-channel signal (represented by L in the figure) and the right-channel signal (represented by R in the figure) to obtain a downmixed signal.

530. Adaptively select a target reverberation gain parameter that needs to be encoded in the reverberation gain parameters corresponding to the subbands of the left-channel signal and the right-channel signal.

540. Separately quantize the target reverberation gain parameter and the downmixed signal to obtain a bitstream.

FIG. 6 is a schematic flowchart of a multi-channel signal decoding method according to an embodiment of this application. In FIG. 6, a multi-channel signal includes a left-channel signal and a right-channel signal. The bitstream generated through encoding in FIG. 5 may be decoded in FIG. 6. A decoding process in FIG. 6 specifically includes the following steps.

610. Obtain a bitstream of the left-channel signal and the right-channel signal.

620. Decode the bitstream to obtain a downmixed signal.

630. Obtain flag information in the bitstream, and determine, based on a flag bit of the flag information, a target reverberation gain parameter that needs to be decoded.

640. Decode reverberation gain parameters corresponding to subbands, for reverberation processing, in the left-channel signal and the right-channel signal, and other spatial parameters (such as an IC, an ILD, an ITD, and an IPD).

640. Perform subsequent processing (for example, smoothing filtering) on spatial parameters obtained through decoding.

650. Perform upmixing processing based on the downmixed signal and the reverberation gain parameters that are obtained through decoding, to obtain the left-channel signal and the right-channel signal.

After upmixing processing is performed to obtain the left-channel signal and the right-channel signal, reverberation processing may be separately performed on the left-channel signal and the right-channel signal based on a coherence signal.

In the method shown in FIG. 6, reverberation processing is performed on the left-channel signal and the right-channel signal based on the target reverberation gain parameter obtained through decoding, and reverberation processing may be performed on some subbands of the left-channel signal and the right-channel signal based on the target reverberation gain parameter, thereby ensuring quality of a channel signal obtained after reverberation processing.

Figure 7:
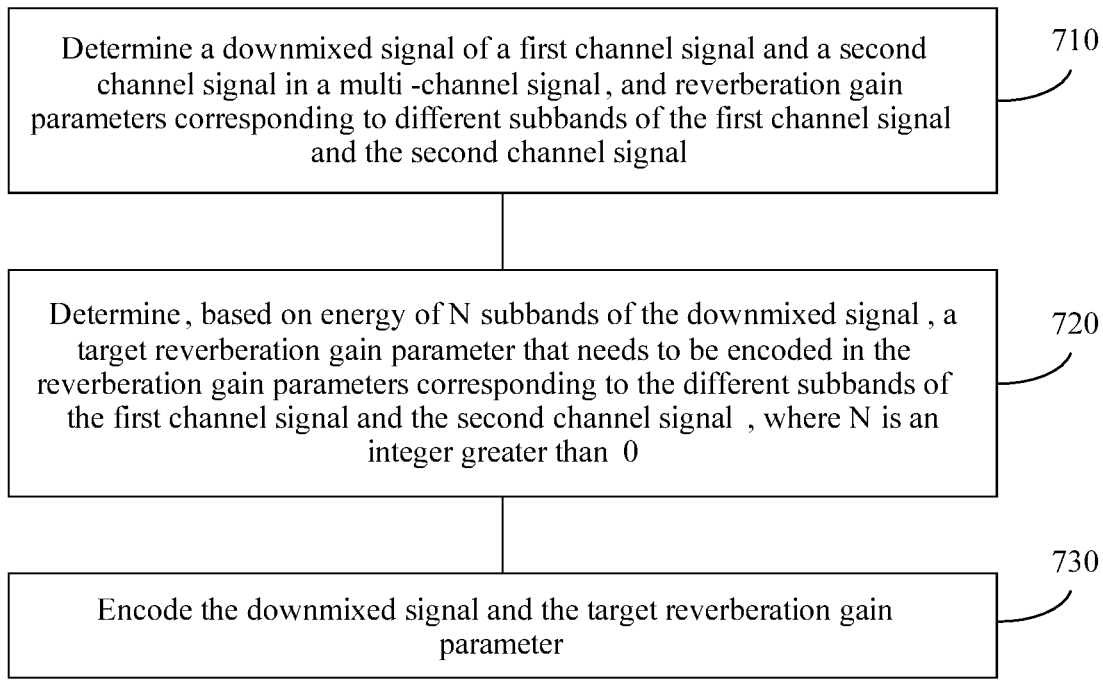
FIG. 7 is a schematic flowchart of a multi-channel signal encoding method according to an embodiment of this application.

FIG. 7 is a schematic flowchart of a multi-channel signal encoding method according to an embodiment of this application. The method in FIG. 7 may be performed by an encoder-side device or an encoder. The method in FIG. 7 includes the following steps.

710. Determine a downmixed signal of a first channel signal and a second channel signal in a multi-channel signal, and reverberation gain parameters corresponding to different subbands of the first channel signal and the second channel signal.

This application sets no limitation on a sequence between a process of generating the downmixed signal and a process of generating the reverberation gain parameters corresponding to the different subbands of the first channel signal and the second channel signal. The processes may be performed simultaneously or in sequence.

In an embodiment, the downmixed signal may be obtained by performing downmixing processing on the first channel signal and the second channel signal. Spatial parameter analysis is performed on the first channel signal and the second channel signal to obtain spatial parameters of the first channel signal and the second channel signal. The spatial parameters include a reverberation gain parameter corresponding to each subband of the first channel signal and the second channel signal, and an IC, an ILD, an ITD, an IPD, and the like between the first channel signal and the second channel signal.

720. Determine, based on energy of N subbands of the downmixed signal, a target reverberation gain parameter that needs to be encoded in the reverberation gain parameters corresponding to the different subbands of the first channel signal and the second channel signal, where N is an integer greater than 0.

Energy of a plurality of subbands of the downmixed signal may be calculated based on the downmixed signal itself, or energy of the downmixed signal may be estimated or deduced using energy of the first channel signal and energy of the second channel signal. When the energy of the downmixed signal is determined using the energy of the first channel signal and the energy of the second channel signal, a calculation process can be simplified to some extent.

In an embodiment, J target subbands may be determined from the N subbands based on the energy of the N subbands of the downmixed signal. Energy of any subband in the J target subbands is greater than energy of another subband different from the J target subbands, both N and J are integers greater than 0, and J is less than N. Reverberation gain parameters corresponding to the J target subbands are determined as target reverberation gain parameters.

A predetermined quantity of subbands are directly selected from all subbands based on energy of each subband of the downmixed signal, and reverberation gain parameters corresponding to the predetermined quantity of subbands are determined as target reverberation gain parameters, so that a reverberation gain parameter that needs to be encoded can be more flexibly selected.

730. Encode the downmixed signal and the target reverberation gain parameter.

In addition, the downmixed signal may be a wideband signal or an ultra-wideband signal. When the downmixed signal is a wideband signal, the plurality of subbands may be all subbands of the downmixed signal, and when the downmixed signal is an ultra-wideband signal, the plurality of subbands may be subbands of the downmixed signal at a wideband part.

In this application, a specific quantity of subbands are directly selected from all subbands based on energy of each subband of the downmixed signal, so that a reverberation gain parameter that needs to be encoded can be more flexibly selected. In addition, compared with a manner of determining a reverberation gain parameter corresponding to a subband of a fixed frequency band as a target reverberation gain parameter, reverberation gain parameters corresponding to some subbands that may not be adjacent in frequency domain can be directly selected as target reverberation gain parameters.

Figure 8:
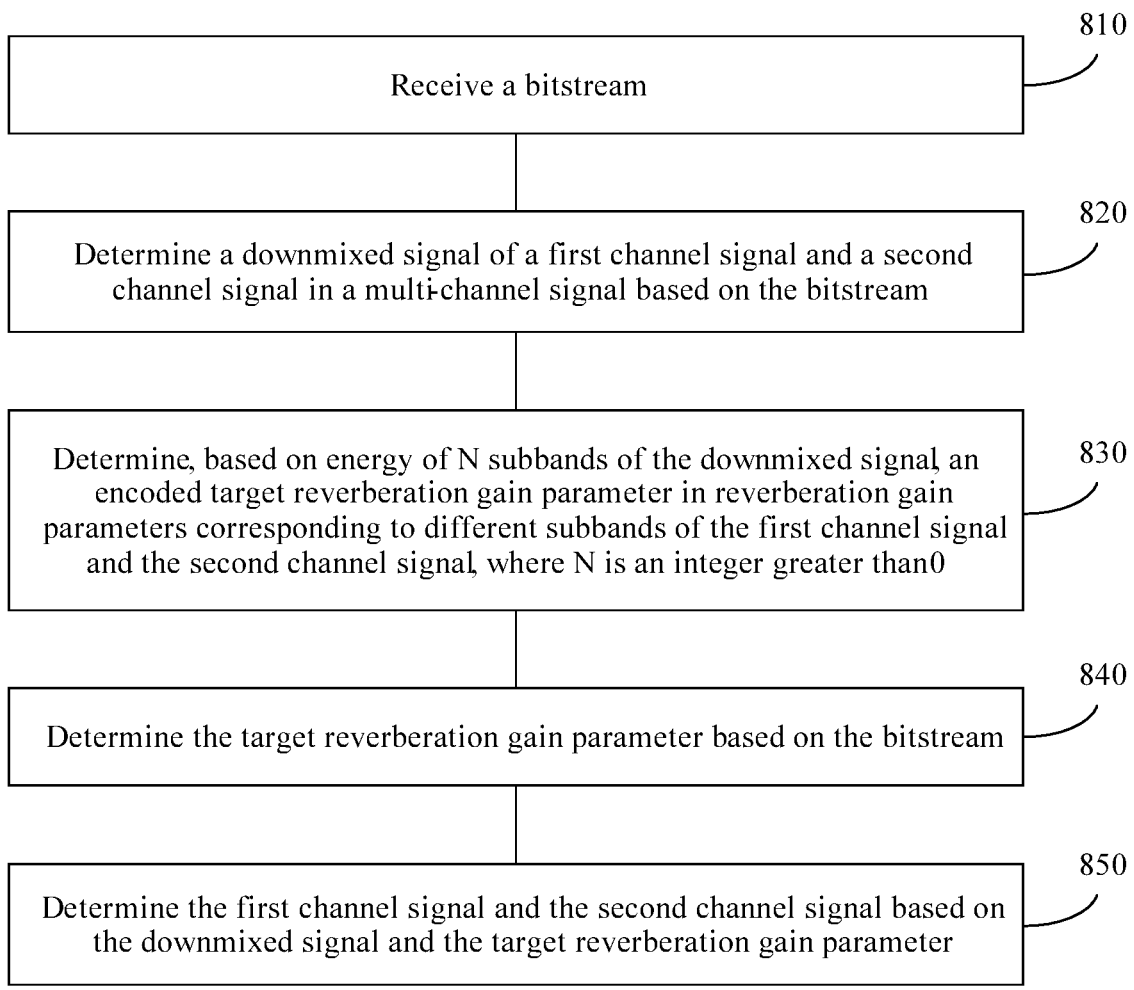
FIG. 8 is a schematic flowchart of a multi-channel signal decoding method according to an embodiment of this application.

FIG. 8 is a schematic flowchart of a multi-channel signal decoding method according to an embodiment of this application. The method in FIG. 8 may be performed by a decoder-side device or a decoder. The decoding method in FIG. 8 corresponds to the encoding method in FIG. 7. The decoding method in FIG. 8 may be used to decode the bitstream obtained by encoding the first channel signal and the second channel signal in the encoding method in FIG. 7. The method in FIG. 8 includes the following steps.

810. Receive a bitstream.

820. Obtain a downmixed signal of a first channel signal and a second channel signal in a multi-channel signal based on the bitstream.

In an embodiment, the bitstream of the first channel signal and the second channel signal may be demultiplexed first, and then the bitstream corresponding to the downmixed signal may be decoded to obtain the downmixed signal.

830. Determine, based on energy of N subbands of the downmixed signal, an encoded target reverberation gain parameter in reverberation gain parameters corresponding to different subbands of the first channel signal and the second channel signal, where N is an integer greater than 0.

In an embodiment, J target subbands may be determined from the N subbands based on the energy of the N subbands. Energy of any subband in the J target subbands is greater than energy of another subband different from the J target subbands, both N and J are integers greater than 0, and J is less than N. Reverberation gain parameters corresponding to the J target subbands are determined as target reverberation gain parameters.

It should be understood that both an encoder side and a decoder side may determine, according to a same rule based on energy of a plurality of subbands of the downmixed signal, the encoded target reverberation gain parameter in the reverberation gain parameters corresponding to the different subbands of the first channel signal and the second channel signal. In this way, the encoder side may not need to indicate an encoded reverberation gain parameter in the bitstream, but the decoder side may determine the encoded reverberation gain parameter using the same rule.

For example, the encoder side determines, based on the energy of the plurality of subbands of the downmixed signal, that reverberation gain parameters corresponding to subbands whose index numbers are 0 to 5 are target reverberation gain parameters, and the encoder side quantizes the reverberation gain parameters corresponding to the subbands whose index numbers are 0 to 5, writes quantized reverberation gain parameters into the bitstream, and transmits the bitstream to the decoder side. After receiving the bitstream, the decoder side determines, also based on the energy of the plurality of subbands of the downmixed signal, that the reverberation gain parameters corresponding to the subbands whose index numbers are 0 to 5 are the target reverberation gain parameters, and then the decoder side decodes the reverberation gain parameters corresponding to the subbands whose index numbers are 0 to 5.

840. Determine the target reverberation gain parameter based on the bitstream.

Other spatial parameters encoded by the encoder side may be obtained from the bitstream, such as an IC, an ILD, an ITD, and an IPD in addition to the target reverberation gain parameter.

850. Determine the first channel signal and the second channel signal based on the downmixed signal and the target reverberation gain parameter.

In this application, the decoder side can directly determine, based on the energy of the plurality of subbands of the downmixed signal, the encoded target reverberation gain parameter in the reverberation gain parameters corresponding to the different subbands of the first channel signal and the second channel signal, so that bits occupied by the decoder side to transmit indication information to indicate the encoded target reverberation gain parameter are reduced, and signaling overheads can be reduced to some extent.

In an embodiment, before reverberation processing is performed on the first channel signal and the second channel signal based on the target reverberation gain parameter, the decoder side further obtains a de-coherence signal, and corrects the de-coherence signal using the target reverberation gain parameter (the de-coherence signal may be obtained by delaying the downmixed signal). Then, reverberation processing may be further performed on the first channel signal and the second channel signal using the corrected de-coherence signal. If each of the first channel signal and the second channel signal includes 10 subbands, and reverberation gain parameters corresponding to subbands whose index numbers are 1, 3, 5, and 7 are target reverberation gain parameters, the decoder side obtains only the reverberation gain parameters corresponding to the subbands whose index numbers are 1, 3, 5, and 7, and does not obtain reverberation gain parameters corresponding to subbands whose index numbers are 2, 4, 6, 8, 9, and 10. Therefore, the decoder side performs reverberation processing only on the subbands, whose index numbers are 1, 3, 5, and 7, of the first channel signal and the second channel signal, and does not perform reverberation processing on the subbands, whose index numbers are 2, 4, 6, 8, 9, and 10, of the first channel signal and the second channel signal.

When the first channel signal and the second channel signal include a left-channel signal and a right-channel signal, the determining the first channel signal and the second channel signal based on the downmixed signal and the target reverberation gain parameter includes determining a de-coherence signal based on a downmixed signal and a target reverberation gain parameter of a frame previous to a current frame, and determining the left-channel signal and the right-channel signal based on the de-coherence signal and a downmixed signal of the current frame.

Figure 9:
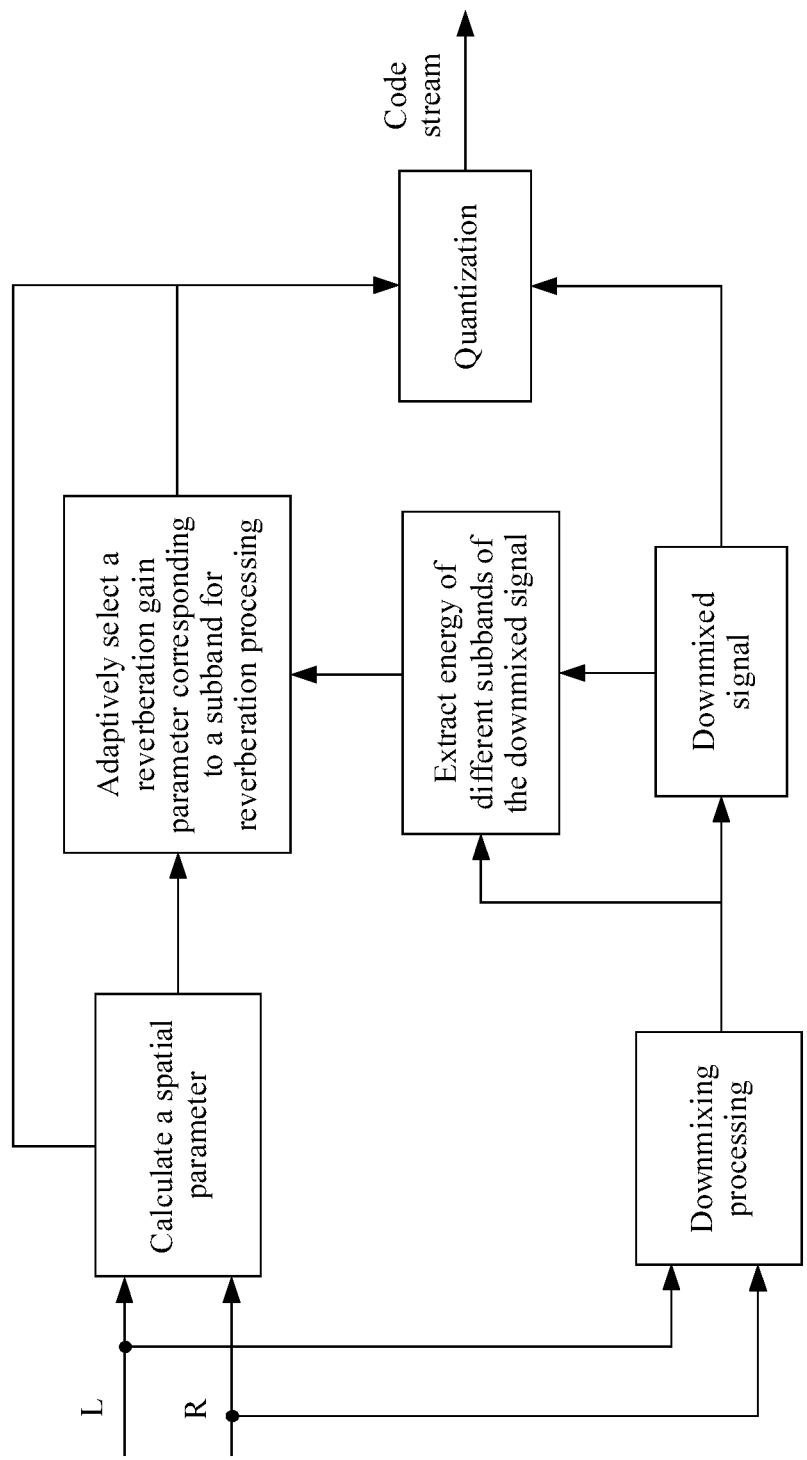
FIG. 9 is a schematic flowchart of a multi-channel signal encoding method according to an embodiment of this application.
Figure 10:
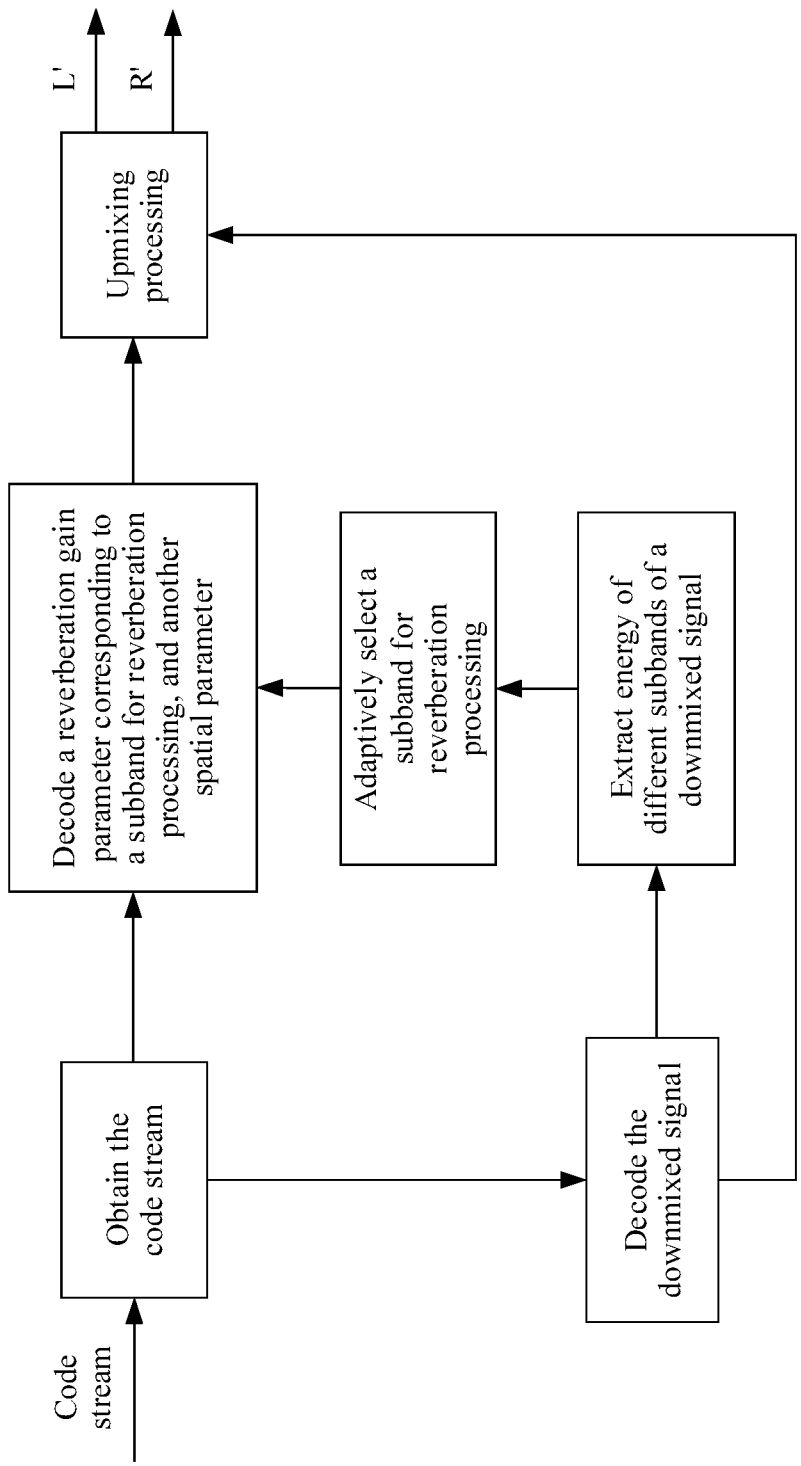
FIG. 10 is a schematic flowchart of a multi-channel signal decoding method according to an embodiment of this application.

With reference to FIG. 9 and FIG. 10, the following describes in detail an entire process of the multi-channel signal encoding method and decoding method in the embodiments of this application using an example of a left-channel signal and a right-channel signal.

FIG. 9 is a schematic flowchart of a multi-channel signal encoding method according to an embodiment of this application. In FIG. 9, a multi-channel signal includes a left-channel signal and a right-channel signal, and a process of encoding the left-channel signal and the right-channel signal specifically includes the following steps.

910. Calculate a spatial parameter of the left-channel signal and a spatial parameter of the right-channel signal.

The spatial parameters include reverberation gain parameters corresponding to subbands of the left-channel signal and the right-channel signal, and other spatial parameters (such as an IC, an ILD, an ITD, and an IPD).

920. Perform downmixing processing on the left-channel signal (represented by L in the figure) and the right-channel signal (represented by R in the figure) to obtain a downmixed signal.

930. Determine energy of different subbands of the downmixed signal.

Energy of the downmixed signal may be calculated based on the downmixed signal itself, or may be estimated or deduced based on energy of the left-channel signal and energy of the right-channel signal.

940. Adaptively select, based on the energy of the different subbands of the downmixed signal, a target reverberation gain parameter that needs to be encoded in the reverberation gain parameters corresponding to the subbands of the left-channel signal and the right-channel signal.

950. Quantize the target reverberation gain parameter and the downmixed signal to obtain a bitstream.

FIG. 10 is a schematic flowchart of a multi-channel signal decoding method according to an embodiment of this application. In FIG. 10, a multi-channel signal includes a left-channel signal and a right-channel signal. The bitstream generated through encoding in FIG. 9 may be decoded in FIG. 10. A decoding process in FIG. 10 specifically includes the following steps.

1010. Obtain a bitstream of the left-channel signal and the right-channel signal.

1020. Decode the bitstream to obtain a downmixed signal.

1030. Determine energy of different subbands of the downmixed signal.

Energy of the downmixed signal may be calculated based on the downmixed signal itself, or may be estimated or deduced based on energy of the left-channel signal and energy of the right-channel signal.

1040. Adaptively select, based on the energy of the different subbands of the downmixed signal, subbands, for reverberation processing, of the left-channel signal and the right-channel signal.

1050. Decode reverberation gain parameters corresponding to the selected subbands, for reverberation processing, of the left-channel signal and the right-channel signal, and other spatial parameters (such as an IC, an ILD, an ITD, and an IPD).

1060. Perform upmixing processing based on the downmixed signal and the reverberation gain parameters that are obtained through decoding (the reverberation gain parameter is a reverberation gain parameter adjusted by an encoder side), to obtain the left-channel signal and the right-channel signal.

After upmixing processing is performed to obtain the left-channel signal and the right-channel signal, reverberation processing may be separately performed on the left-channel signal and the right-channel signal based on a coherence signal.

In the method shown in FIG. 10, reverberation processing is performed on the left-channel signal and the right-channel signal based on the target reverberation gain parameter obtained through decoding, and reverberation processing may be performed on some subbands of the left-channel signal and the right-channel signal based on the target reverberation gain parameter, thereby ensuring quality of a channel signal obtained after reverberation processing.

The foregoing describes the multi-channel signal encoding method and the multi-channel signal decoding method in the embodiments of this application in detail with reference to FIG. 3 to FIG. 10. The following describes an encoder and a decoder in the embodiments of this application with reference to FIG. 11 to FIG. 18. It should be understood that the encoder and the decoder in FIG. 11 to FIG. 18 can implement the steps performed by the encoder and the decoder in the encoding method and the decoding method in the embodiments of this application. For brevity, repeated descriptions are properly omitted below.

Figure 11:
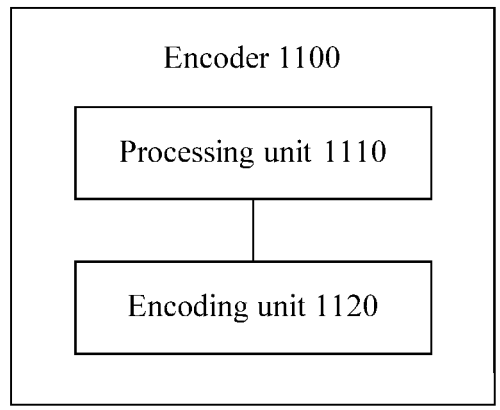
FIG. 11 is a schematic block diagram of an encoder according to an embodiment of this application.

FIG. 11 is a schematic block diagram of an encoder according to an embodiment of this application. An encoder 1100 in FIG. 11 includes a processing unit 1110 configured to determine a downmixed signal of a first channel signal and a second channel signal in a multi-channel signal, and reverberation gain parameters corresponding to different subbands of the first channel signal and the second channel signal, where the processing unit 1110 is further configured to determine a target reverberation gain parameter that needs to be encoded in the reverberation gain parameters corresponding to the different subbands of the first channel signal and the second channel signal, and the processing unit 1110 is further configured to generate parameter indication information, where the parameter indication information is used to indicate a subband corresponding to the target reverberation gain parameter, and an encoding unit 1120 configured to encode the target reverberation gain parameter, the parameter indication information, and the downmixed signal to generate a bitstream.

In this application, when the first channel signal and the second channel signal are being encoded, reverberation gain parameters corresponding to only some subbands of the first channel signal and the second channel signal may be encoded. Compared with a manner in other approaches in which reverberation gain parameters corresponding to all subbands of the first channel signal and the second channel signal need to be encoded, bit overheads can be reduced to some extent, and encoding efficiency can be improved. Further, a quantity of saved bits may be used to encode another parameter or allocate more bits to the downmixed signal if reverberation gain parameters corresponding to some subbands are encoded, thereby improving overall encoding performance.

The encoder 1100 may be corresponding to the multi-channel signal encoding method in FIG. 3, and the encoder 1100 may perform the multi-channel signal encoding method in FIG. 3.

Optionally, in an embodiment, the processing unit 1110 is specifically configured to determine the target reverberation gain parameter based on at least one of coherence between energy of the first channel signal and energy of the downmixed signal and coherence between energy of the second channel signal and the energy of the downmixed signal.

Optionally, in an embodiment, each of the first channel signal and the second channel signal includes a plurality of frequency bins, and the processing unit 1110 is specifically configured to determine a first difference value between the energy of the first channel signal and the energy of the downmixed signal, where the first difference value is used to indicate a sum of absolute values of difference values between energy of the first channel signal and energy of the downmixed signal at the plurality of frequency bins, and when the first difference value is greater than a first threshold, determine that a reverberation gain parameter corresponding to a subband of a first frequency band is the target reverberation gain parameter, where the first frequency band is a part of all frequency bands of each of the first channel signal and the second channel signal.

Optionally, in an embodiment, each of the first channel signal and the second channel signal includes a plurality of frequency bins, and the processing unit 1110 is specifically configured to determine a second difference value between the energy of the second channel signal and the energy of the downmixed signal, where the second difference value is used to indicate a sum of absolute values of difference values between energy of the second channel signal and energy of the downmixed signal at the plurality of frequency bins, and when the second difference value is greater than a second threshold, determine that a reverberation gain parameter corresponding to a subband of a first frequency band is the target reverberation gain parameter, where the first frequency band is a part of all frequency bands of each of the first channel signal and the second channel signal.

Optionally, in an embodiment, each of the first channel signal and the second channel signal includes a plurality of frequency bins, and the processing unit 1110 is specifically configured to determine a first difference value between the energy of the first channel signal and the energy of the downmixed signal, where the first difference value is used to indicate a sum of absolute values of difference values between energy of the first channel signal and energy of the downmixed signal at the plurality of frequency bins, determine a second difference value between the energy of the second channel signal and the energy of the downmixed signal, where the second difference value is used to indicate a sum of absolute values of difference values between energy of the second channel signal and energy of the downmixed signal at the plurality of frequency bins, and when the first difference value is greater than a first threshold, and the second difference value is greater than a second threshold, determine that a reverberation gain parameter corresponding to a subband of a first frequency band is the target reverberation gain parameter, where the first frequency band is a part of all frequency bands of each of the first channel signal and the second channel signal.

Optionally, in an embodiment, a frequency of the first frequency band is less than a frequency of another frequency band different from the first frequency band in the first channel signal and the second channel signal.

Optionally, in an embodiment, the plurality of frequency bins are in a second frequency band of each of the first channel signal and the second channel signal, and a frequency of the second frequency band is greater than a frequency of another frequency band, different from the second frequency band, in the first channel signal and the second channel signal.

Optionally, in an embodiment, the processing unit 1110 is specifically configured to determine energy of N subbands of the downmixed signal, determine M subbands from the N subbands, where energy of any subband in the M subbands is greater than energy of any subband in N-M subbands in the N subbands except the M subbands, both M and N are integers greater than 0, and M is less than N, and determine the target reverberation gain parameter based on a magnitude relationship between energy of the M subbands of the downmixed signal and energy of the N-M subbands of the downmixed signal.

Optionally, in an embodiment, the processing unit 1110 is specifically configured to, when a sum of the energy of the M subbands is greater than L times of a sum of the energy of the N-M subbands, determine that a reverberation gain parameter corresponding to a subband of a first frequency band of the first channel signal and the second channel signal is the target reverberation gain parameter, where the first frequency band is a part of all frequency bands of each of the first channel signal and the second channel signal, and L is a real number greater than 0.

Optionally, in an embodiment, the processing unit 1110 is specifically configured to determine energy of N subbands of the downmixed signal, determine M subbands from the N subbands, where energy of any subband in the M subbands is greater than energy of any subband in N-M subbands in the N subbands except the M subbands, and when an index value of a first subband in the M subbands is less than a preset index value, determine that a reverberation gain parameter corresponding to a subband of a first frequency band of the first channel signal and the second channel signal is the target reverberation gain parameter, where a frequency of any frequency bin in the first subband is greater than a frequency of any frequency bin in another subband in the M subbands except the first subband, and the first frequency band is a part of all frequency bands of each of the first channel signal and the second channel signal.

Optionally, in an embodiment, the processing unit 1110 is specifically configured to determine J target subbands from the N subbands, where energy of any subband in the J target subbands is greater than energy of another subband different from the J target subbands, both N and J are integers greater than 0, and J is less than N, and determine reverberation gain parameters corresponding to the J target subbands as target reverberation gain parameters.

Optionally, in an embodiment, the energy of the downmixed signal is determined based on the energy of the first channel signal and the energy of the second channel signal.

Figure 12:
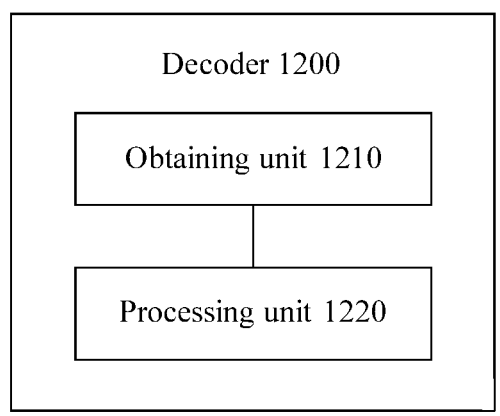
FIG. 12 is a schematic block diagram of a decoder according to an embodiment of this application.

FIG. 12 is a schematic block diagram of a decoder according to an embodiment of this application. A decoder 1200 in FIG. 12 includes an obtaining unit 1210 configured to receive a bitstream, where the obtaining unit 1210 is further configured to obtain a downmixed signal of a first channel signal and a second channel signal in a multi-channel signal and parameter indication information based on the bitstream, where the parameter indication information is used to indicate an encoded target reverberation gain parameter in reverberation gain parameters corresponding to different subbands of the first channel signal and the second channel signal, and the obtaining unit 1210 is further configured to obtain the target reverberation gain parameter from the bitstream according to the parameter indication information, and a processing unit 1220 configured to determine the first channel signal and the second channel signal based on the downmixed signal and the target reverberation gain parameter.

In this application, the target reverberation gain parameter encoded by an encoder can be determined using the parameter indication information, and then reverberation processing is performed on a corresponding subband of the first channel signal and the second channel signal based on the target reverberation gain parameter.

The decoder 1200 may be corresponding to the multi-channel signal decoding method in FIG. 4, and the decoder 1200 may perform the multi-channel signal decoding method in FIG. 4.

Figure 13:
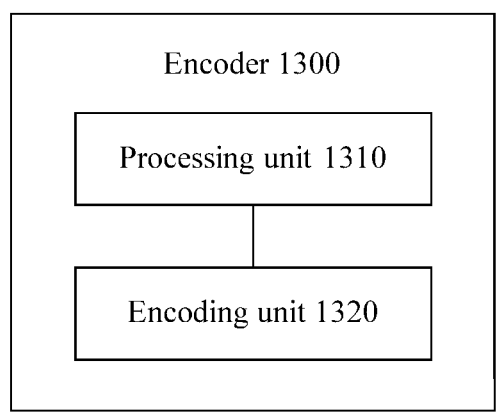
FIG. 13 is a schematic block diagram of an encoder according to an embodiment of this application.

FIG. 13 is a schematic block diagram of an encoder according to an embodiment of this application. An encoder 1300 in FIG. 13 includes a processing unit 1310 configured to determine a downmixed signal of a first channel signal and a second channel signal in a multi-channel signal, and reverberation gain parameters corresponding to different subbands of the first channel signal and the second channel signal, where the processing unit 1310 is further configured to determine, based on energy of N subbands of the downmixed signal, a target reverberation gain parameter that needs to be encoded in the reverberation gain parameters corresponding to the different subbands of the first channel signal and the second channel signal, where N is an integer greater than 0, and an encoding unit 1320 configured to encode the downmixed signal and the target reverberation gain parameter.

In this application, a specific quantity of subbands are directly selected from all subbands based on energy of each subband of the downmixed signal, so that a reverberation gain parameter that needs to be encoded can be more flexibly selected.

The encoder 1300 may be corresponding to the multi-channel signal encoding method in FIG. 7, and the encoder 1300 may perform the multi-channel signal encoding method in FIG. 7.

Optionally, in an embodiment, the processing unit 1310 is specifically configured to determine J target subbands from the N subbands, where energy of any subband in the J target subbands is greater than energy of another subband different from the J target subbands, both N and J are integers greater than 0, and J is less than N, and determine reverberation gain parameters corresponding to the J target subbands as target reverberation gain parameters.

Figure 14:
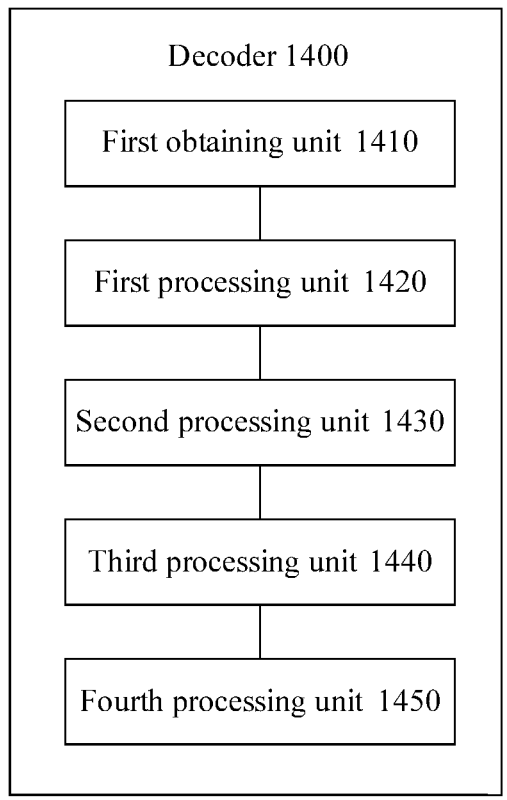
FIG. 14 is a schematic block diagram of a decoder according to an embodiment of this application.

FIG. 14 is a schematic block diagram of a decoder according to an embodiment of this application. A decoder 1400 in FIG. 14 includes a first obtaining unit 1410 configured to receive a bitstream, a first processing unit 1420 configured to determine a downmixed signal of the first channel signal and a second channel signal in a multi-channel signal based on the bitstream, a second processing unit 1430 configured to determine, based on energy of N subbands of the downmixed signal, an encoded target reverberation gain parameter in reverberation gain parameters corresponding to different subbands of the first channel signal and the second channel signal, where N is an integer greater than 0, a third processing unit 1440 configured to determine the target reverberation gain parameter based on the bitstream, and a fourth processing unit 1450 configured to determine the first channel signal and the second channel signal based on the downmixed signal and the target reverberation gain parameter.

In this application, a decoder side can directly determine, based on energy of a plurality of subbands of the downmixed signal, the encoded target reverberation gain parameter in the reverberation gain parameters corresponding to the different subbands of the first channel signal and the second channel signal, so that bits occupied by the decoder side to transmit indication information to indicate the encoded target reverberation gain parameter are reduced, and signaling overheads can be reduced to some extent.

The decoder 1400 may be corresponding to the multi-channel signal decoding method in FIG. 8, and the decoder 1400 may perform the multi-channel signal decoding method in FIG. 8.

Optionally, in an embodiment, the first processing unit 1420 is specifically configured to determine J target subbands from the N subbands based on the energy of the N subbands, where energy of any subband in the J target subbands is greater than energy of another subband different from the J target subbands, both N and J are integers greater than 0, and J is less than N, and determine reverberation gain parameters corresponding to the J target subbands as target reverberation gain parameters.

Figure 15:
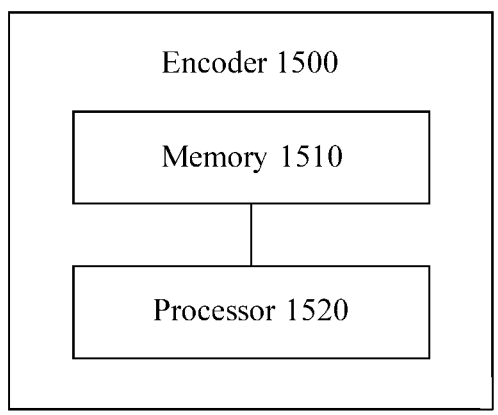
FIG. 15 is a schematic block diagram of an encoder according to an embodiment of this application.

FIG. 15 is a schematic block diagram of an encoder according to an embodiment of this application. An encoder 1500 in FIG. 15 includes a memory 1510 configured to store a program, and a processor 1520 configured to execute the program, and when the program is executed, the processor 1520 is configured to determine a downmixed signal of a first channel signal and a second channel signal in a multi-channel signal, and reverberation gain parameters corresponding to different subbands of the first channel signal and the second channel signal, determine a target reverberation gain parameter that needs to be encoded in the reverberation gain parameters corresponding to the different subbands of the first channel signal and the second channel signal, generate parameter indication information, where the parameter indication information is used to indicate a subband corresponding to the target reverberation gain parameter, and encode the target reverberation gain parameter, the parameter indication information, and the downmixed signal to generate a bitstream.

In this application, when the first channel signal and the second channel signal are being encoded, reverberation gain parameters corresponding to only some subbands of the first channel signal and the second channel signal may be encoded. Compared with a manner in other approaches in which reverberation gain parameters corresponding to all subbands of the first channel signal and the second channel signal need to be encoded, bit overheads can be reduced to some extent, and encoding efficiency can be improved. Further, a quantity of saved bits may be used to encode another parameter or allocate more bits to the downmixed signal if reverberation gain parameters corresponding to some subbands are encoded, thereby improving overall encoding performance.

The encoder 1500 may be corresponding to the multi-channel signal encoding method in FIG. 3, and the encoder 1500 may perform the multi-channel signal encoding method in FIG. 3.

Optionally, in an embodiment, the processor 1520 is specifically configured to determine the target reverberation gain parameter based on at least one of coherence between energy of the first channel signal and energy of the downmixed signal and coherence between energy of the second channel signal and the energy of the downmixed signal.

Optionally, in an embodiment, each of the first channel signal and the second channel signal includes a plurality of frequency bins, and the processor 1520 is specifically configured to determine a first difference value between the energy of the first channel signal and the energy of the downmixed signal, where the first difference value is used to indicate a sum of absolute values of difference values between energy of the first channel signal and energy of the downmixed signal at the plurality of frequency bins, and when the first difference value is greater than a first threshold, determine that a reverberation gain parameter corresponding to a subband of a first frequency band is the target reverberation gain parameter, where the first frequency band is a part of all frequency bands of each of the first channel signal and the second channel signal.

Optionally, in an embodiment, each of the first channel signal and the second channel signal includes a plurality of frequency bins, and the processor 1520 is specifically configured to determine a second difference value between the energy of the second channel signal and the energy of the downmixed signal, where the second difference value is used to indicate a sum of absolute values of difference values between energy of the second channel signal and energy of the downmixed signal at the plurality of frequency bins, and when the second difference value is greater than a second threshold, determine that a reverberation gain parameter corresponding to a subband of a first frequency band is the target reverberation gain parameter, where the first frequency band is a part of all frequency bands of each of the first channel signal and the second channel signal.

Optionally, in an embodiment, each of the first channel signal and the second channel signal includes a plurality of frequency bins, and the processor 1520 is specifically configured to determine a first difference value between the energy of the first channel signal and the energy of the downmixed signal, where the first difference value is used to indicate a sum of absolute values of difference values between energy of the first channel signal and energy of the downmixed signal at the plurality of frequency bins, determine a second difference value between the energy of the second channel signal and the energy of the downmixed signal, where the second difference value is used to indicate a sum of absolute values of difference values between energy of the second channel signal and energy of the downmixed signal at the plurality of frequency bins, and when the first difference value is greater than a first threshold, and the second difference value is greater than a second threshold, determine that a reverberation gain parameter corresponding to a subband of a first frequency band is the target reverberation gain parameter, where the first frequency band is a part of all frequency bands of each of the first channel signal and the second channel signal.

Optionally, in an embodiment, a frequency of the first frequency band is less than a frequency of another frequency band different from the first frequency band in the first channel signal and the second channel signal.

Optionally, in an embodiment, the plurality of frequency bins are in a second frequency band of each of the first channel signal and the second channel signal, and a frequency of the second frequency band is greater than a frequency of another frequency band, different from the second frequency band, in the first channel signal and the second channel signal.

Optionally, in an embodiment, the processor 1520 is specifically configured to determine energy of N subbands of the downmixed signal, determine M subbands from the N subbands, where energy of any subband in the M subbands is greater than energy of any subband in N-M subbands in the N subbands except the M subbands, both M and N are integers greater than 0, and M is less than N, and determine the target reverberation gain parameter based on a magnitude relationship between energy of the M subbands and energy of the N-M subbands.

Optionally, in an embodiment, the processor 1520 is specifically configured to, when a sum of the energy of the M subbands is greater than L times of a sum of the energy of the N-M subbands, determine that a reverberation gain parameter corresponding to a subband of a first frequency band of the first channel signal and the second channel signal is the target reverberation gain parameter, where the first frequency band is a part of all frequency bands of each of the first channel signal and the second channel signal, and L is a real number greater than 0.

Optionally, in an embodiment, the processor 1520 is specifically configured to determine energy of N subbands of the downmixed signal, determine M subbands from the N subbands, where energy of any subband in the M subbands is greater than energy of any subband in N-M subbands in the N subbands except the M subbands, and when an index value of a first subband in the M subbands is less than a preset index value, determine that a reverberation gain parameter corresponding to a subband of a first frequency band of the first channel signal and the second channel signal is the target reverberation gain parameter, where a frequency of any frequency bin in the first subband is greater than a frequency of any frequency bin in another subband in the M subbands except the first subband, and the first frequency band is a part of all frequency bands of each of the first channel signal and the second channel signal.

Optionally, in an embodiment, the processor 1520 is specifically configured to determine energy of N subbands of the downmixed signal, determine J target subbands from the N subbands based on the energy of the N subbands, where energy of any subband in the J target subbands is greater than energy of another subband different from the J target subbands, both N and J are integers greater than 0, and J is less than N, and determine reverberation gain parameters corresponding to the J target subbands as target reverberation gain parameters.

Optionally, in an embodiment, the energy of the downmixed signal is determined based on the energy of the first channel signal and the energy of the second channel signal.

Figure 16:
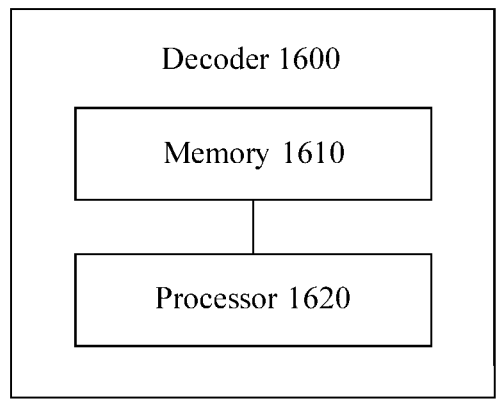
FIG. 16 is a schematic block diagram of a decoder according to an embodiment of this application.

FIG. 16 is a schematic block diagram of a decoder according to an embodiment of this application. A decoder 1600 in FIG. 16 includes a memory 1610 configured to store a program, and a processor 1620 configured to execute the program, and when the program is executed, the processor 1620 is configured to receive a bitstream, obtain a downmixed signal of a first channel signal and a second channel signal in a multi-channel signal and parameter indication information based on the bitstream, where the parameter indication information is used to indicate an encoded target reverberation gain parameter in reverberation gain parameters corresponding to different subbands of the first channel signal and the second channel signal, obtain the target reverberation gain parameter from the bitstream according to the parameter indication information, and determine the first channel signal and the second channel signal based on the downmixed signal and the target reverberation gain parameter.

In this application, the target reverberation gain parameter encoded by an encoder can be determined using the parameter indication information, and then reverberation processing is performed on a corresponding subband of the first channel signal and the second channel signal based on the target reverberation gain parameter.

The decoder 1600 may be corresponding to the multi-channel signal decoding method in FIG. 4, and the decoder 1600 may perform the multi-channel signal decoding method in FIG. 4.

Figure 17:
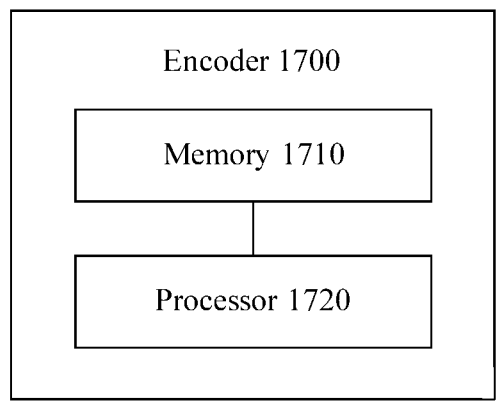
FIG. 17 is a schematic block diagram of an encoder according to an embodiment of this application.

FIG. 17 is a schematic block diagram of an encoder according to an embodiment of this application. An encoder 1700 in FIG. 17 includes a memory 1710 configured to store a program, and a processor 1720 configured to execute the program, and when the program is executed, the processor 1720 is configured to determine a downmixed signal of a first channel signal and a second channel signal in a multi-channel signal, and reverberation gain parameters corresponding to different subbands of the first channel signal and the second channel signal, determine, based on energy of N subbands of the downmixed signal, a target reverberation gain parameter that needs to be encoded in the reverberation gain parameters corresponding to the different subbands of the first channel signal and the second channel signal, where N is an integer greater than 0, and encode the downmixed signal and the target reverberation gain parameter.

In this application, a specific quantity of subbands are directly selected from all subbands based on energy of each subband of the downmixed signal, so that a reverberation gain parameter that needs to be encoded can be more flexibly selected.

The encoder 1700 may be corresponding to the multi-channel signal encoding method in FIG. 7, and the encoder 1700 may perform the multi-channel signal encoding method in FIG. 7.

Optionally, in an embodiment, the processor 1720 is specifically configured to determine J target subbands from the N subbands based on the energy of the N subbands, where energy of any subband in the J target subbands is greater than energy of another subband different from the J target subbands, both N and J are integers greater than 0, and J is less than N, and determine reverberation gain parameters corresponding to the J target subbands as target reverberation gain parameters.

Figure 18:
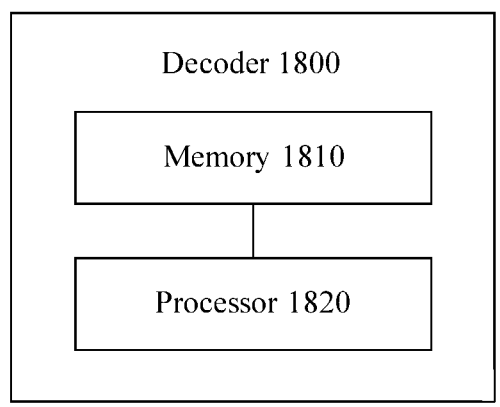
FIG. 18 is a schematic block diagram of a decoder according to an embodiment of this application.

FIG. 18 is a schematic block diagram of a decoder according to an embodiment of this application. A decoder 1800 in FIG. 18 includes a memory 1810 configured to store a program, and a processor 1820 configured to execute the program, and when the program is executed, the processor 1820 is configured to receive a bitstream, determine a downmixed signal of a first channel signal and a second channel signal in a multi-channel signal based on the bitstream, determine, based on energy of N subbands of the downmixed signal, an encoded target reverberation gain parameter in reverberation gain parameters corresponding to different subbands of the first channel signal and the second channel signal, where N is an integer greater than 0, determine the target reverberation gain parameter based on the bitstream, and determine the first channel signal and the second channel signal based on the downmixed signal and the target reverberation gain parameter.

In this application, a decoder side can directly determine, based on energy of a plurality of subbands of the downmixed signal, the encoded target reverberation gain parameter in the reverberation gain parameters corresponding to the different subbands of the first channel signal and the second channel signal, so that bits occupied by the decoder side to transmit indication information to indicate the encoded target reverberation gain parameter are reduced, and signaling overheads can be reduced to some extent.

The decoder 1800 may be corresponding to the multi-channel signal decoding method in FIG. 8, and the decoder 1800 may perform the multi-channel signal decoding method in FIG. 8.

Optionally, in an embodiment, the processor 1820 is specifically configured to determine J target subbands from the N subbands based on the energy of the N subbands, where energy of any subband in the J target subbands is greater than energy of another subband different from the J target subbands, both N and J are integers greater than 0, and J is less than N, and determine reverberation gain parameters corresponding to the J target subbands as target reverberation gain parameters.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in an embodiment. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to other approaches, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A multi-channel signal encoding method, comprising:
   obtaining a downmixed signal corresponding to a first channel signal and a second channel signal in a multi-channel signal, and reverberation gain parameters corresponding to different subbands of the first channel signal and the second channel signal;
   selecting a target reverberation gain parameter to be encoded from the reverberation gain parameters;
   generating parameter indication information indicating a subband corresponding to the target reverberation gain parameter; and
   encoding the target reverberation gain parameter, the parameter indication information, and the downmixed signal to generate a bitstream.

2. The multi-channel signal encoding method of claim 1, wherein selecting the target reverberation gain parameter to be encoded from the reverberation gain parameters comprises selecting the target reverberation gain parameter based on at least one of a first coherence between an energy of the first channel signal and an energy of the downmixed signal or a second coherence between an energy of the second channel signal and the energy of the downmixed signal.

3. The multi-channel signal encoding method of claim 2, wherein the first channel signal and the second channel signal comprise a plurality of frequency bins, wherein selecting the target reverberation gain parameter based on either the first coherence between the energy of the first channel signal and the energy of the downmixed signal or the second coherence between the energy of the second channel signal and the energy of the downmixed signal comprises:
   obtaining a first difference value between the energy of the first channel signal and the energy of the downmixed signal, wherein the first difference value indicates a sum of absolute values of differences between the energy of the first channel signal and the energy of the downmixed signal at the frequency bins; and selecting the reverberation gain parameter corresponding to a subband of a first frequency band as the target reverberation gain parameter when the first difference value is greater than a first threshold, wherein the first frequency band is within the first channel signal and the second channel signal.

4. The multi-channel signal encoding method of claim 3, wherein a frequency of the first frequency band is less than a frequency of any other frequency band in the first channel signal and the second channel signal.

5. The multi-channel signal encoding method of claim 3, wherein the frequency bins are in a second frequency band of the first channel signal and the second channel signal, and wherein a frequency of the second frequency band is greater than a frequency of another frequency band in the first channel signal and the second channel signal.

6. The multi-channel signal encoding method of claim 2, wherein the first channel signal and the second channel signal comprise a plurality of frequency bins, wherein selecting the target reverberation gain parameter based on the first coherence between the energy of the first channel signal and the energy of the downmixed signal or the second coherence between the energy of the second channel signal and the energy of the downmixed signal comprises:

obtaining a second difference value between the energy of the second channel signal and the energy of the downmixed signal, wherein the second difference value indicates a sum of absolute values of differences between the energy of the second channel signal and the energy of the downmixed signal at the frequency bins; and selecting the reverberation gain parameter corresponding to a subband of a first frequency band as the target reverberation gain parameter when the second difference value is greater than a second threshold, wherein the first frequency band is within the first channel signal and the second channel signal.

7. The multi-channel signal encoding method of claim 2, wherein the first channel signal and the second channel signal comprise a plurality of frequency bins, wherein selecting the target reverberation gain parameter based on the first coherence between the energy of the first channel signal and the energy of the downmixed signal or the second coherence between the energy of the second channel signal and the energy of the downmixed signal comprises:

obtaining a first difference value between the energy of the first channel signal and the energy of the downmixed signal, wherein the first difference value indicates a sum of absolute values of differences between the energy of the first channel signal and the energy of the downmixed signal at the frequency bins;

obtaining a second difference value between the energy of the second channel signal and the energy of the downmixed signal, wherein the second difference value indicates a sum of absolute values of differences between the energy of the second channel signal and the energy of the downmixed signal at the frequency bins; and selecting the reverberation gain parameter corresponding to a subband of a first frequency band as the target reverberation gain parameter when the first difference value is greater than a first threshold and the second difference value is greater than a second threshold, wherein the first frequency band is within the first channel signal and the second channel signal.

8. The multi-channel signal encoding method of claim 2, wherein the energy of the downmixed signal is determined based on the energy of the first channel signal and the energy of the second channel signal.

9. The multi-channel signal encoding method of claim 1, wherein selecting the target reverberation gain parameter to be encoded from the reverberation gain parameters, comprises:

selecting M subbands from N subbands from the downmixed signal, wherein an energy of any subband in the M subbands is greater than an energy of any subband in the N subbands excluding the M subbands, wherein both M and N are integers greater than 0, and wherein M is less than N; and selecting the target reverberation gain parameter based on a magnitude relationship between a total energy of the M subbands and a total energy of the N subbands excluding the M subbands.

10. The multi-channel signal encoding method of claim 9, wherein selecting the target reverberation gain parameter based on the magnitude relationship between the total energy of the M subbands and the total energy of the N subbands excluding the M subbands comprises selecting the reverberation gain parameter corresponding to a subband of a first frequency band as the target reverberation gain parameter when the total energy of the M subbands is greater than L times the total energy of the N subbands excluding the M subbands, wherein the first frequency band is within the first channel signal and the second channel signal, and wherein L is a real number greater than 0.

11. The multi-channel signal encoding method of claim 1, wherein selecting the target reverberation gain parameter to be encoded in the reverberation gain parameters comprises:

selecting M subbands from N subbands from the downmixed signal, wherein an energy of any subband in the M subbands is greater than an energy of any subband in the N subbands excluding the M subbands; and selecting the reverberation gain parameter corresponding to a subband of a first frequency band as the target reverberation gain parameter when an index value of an initial subband in the M subbands is less than a preset index value, wherein a frequency bin in the initial subband is greater than a frequency from the frequency bin in another subband in the M subbands, and wherein the first frequency band is within the first channel signal and the second channel signal.

12. The multi-channel signal encoding method of claim 1, wherein selecting the target reverberation gain parameter to be encoded in the reverberation gain parameters comprises:

selecting, based on an energy of N subbands from the downmixed signal, J target subbands from the N subbands, wherein an energy of any subband in the J target subbands is greater than an energy of any subband in the N subbands excluding the J target subbands, wherein both N and J are integers greater than 0, and wherein J is less than N; and selecting the reverberation gain parameters corresponding to the J target subbands as the target reverberation gain parameters.

13. A multi-channel signal encoder, comprising:
a memory for storing computer executable instructions; and
a processor operatively coupled to the memory, the processor being configured to execute the computer-executable instructions to:

obtain a downmixed signal corresponding to a first channel signal and a second channel signal in a multi-channel signal, and reverberation gain parameters corresponding to different subbands of the first channel signal and the second channel signal;

select a target reverberation gain parameter to be encoded in the reverberation gain parameters; and generate parameter indication information indicating a subband corresponding to the target reverberation gain parameter; and encode the target reverberation gain parameter, the parameter indication information, and the downmixed signal to generate a bitstream.

14. The multi-channel signal encoder of claim 13, wherein the processor is further configured to select the target reverberation gain parameter based on at least one of a first coherence between an energy of the first channel signal and an energy of the downmixed signal or a second coherence between an energy of the second channel signal and the energy of the downmixed signal.

15. The multi-channel signal encoder of claim 14, wherein the first channel signal and the second channel signal comprise a plurality of frequency bins, wherein the processor is further configured to:

obtain a first difference value between the energy of the first channel signal and the energy of the downmixed signal, wherein the first difference value indicates a sum of absolute values of differences between the energy of the first channel signal and the energy of the downmixed signal at the frequency bins; and select the reverberation gain parameter corresponding to a subband of a first frequency band as the target reverberation gain parameter when the first difference value is greater than a first threshold, wherein the first frequency band is within the first channel signal and the second channel signal.

16. The multi-channel signal encoder of claim 15, wherein a frequency of the first frequency band is less than a frequency of any other frequency band in the first channel signal and the second channel signal.

17. The multi-channel signal encoder of claim 15, wherein the frequency bins are in a second frequency band of the first channel signal and the second channel signal, and wherein a frequency of the second frequency band is greater than any other frequency band in the first channel signal and the second channel signal.

18. The multi-channel signal encoder of claim 15, wherein the energy of the downmixed signal is determined based on the energy of the first channel signal and the energy of the second channel signal.

19. The multi-channel signal encoder of claim 14, wherein the first channel signal and the second channel signal comprise a plurality of frequency bins, wherein the processor is further configured to:

obtain a second difference value between the energy of the second channel signal and the energy of the downmixed signal, wherein the second difference value indicates a sum of absolute values of differences between the energy of the second channel signal and the energy of the downmixed signal at the frequency bins; and select the reverberation gain parameter corresponding to a subband of a first frequency band is the target reverberation gain parameter when the second difference value is greater than a second threshold, wherein the first frequency band within the first channel signal and the second channel signal.

20. The multi-channel signal encoder of claim 14, wherein the first channel signal and the second channel signal comprise a plurality of frequency bins, wherein the processor is further configured to:

obtain a first difference value between the energy of the first channel signal and the energy of the downmixed signal, wherein the first difference value indicates a sum of absolute values of differences between the energy of the first channel signal and the energy of the downmixed signal at the frequency bins;

obtain a second difference value between the energy of the second channel signal and the energy of the downmixed signal, wherein the second difference value indicates a sum of absolute values of differences between the energy of the second channel signal and the energy of the downmixed signal at the frequency bins; and select the reverberation gain parameter corresponding to a subband of a first frequency band is the target reverberation gain parameter when the first difference value is greater than a first threshold, and the second difference value is greater than a second threshold, wherein the first frequency band is within the first channel signal and the second channel signal.

21. The multi-channel signal encoder of claim 14, wherein the processor is further configured to:

select M subbands from N subbands from the downmixed signal, wherein an energy of any subband in the M subbands is greater than an energy of any subband in the N subbands excluding the M subbands, wherein both M and N are integers greater than 0, and wherein M is less than N; and select the target reverberation gain parameter based on a magnitude relationship between a total energy of the M subbands and a total energy of the N subbands excluding the M subbands.

22. The multi-channel signal encoder of claim 21, wherein the processor is further configured to select the reverberation gain parameter corresponding to a subband of a first frequency band as the target reverberation gain parameter when the total energy of the M subbands is greater than L times the total energy of the N subbands excluding the M subbands, wherein the first frequency band is within the first channel signal and the second channel signal, wherein L is a real number greater than 0.

23. The multi-channel signal encoder of claim 14, wherein the processor is further configured to:

select M subbands from N subbands from the downmixed signal, wherein an energy of any subband in the M subbands is greater than an energy of any subband in the N subbands excluding the M subbands; and select the reverberation gain parameter corresponding to a subband of a first frequency band as the target reverberation gain parameter when an index value of an initial subband in the M subbands is less than a preset index value, wherein a frequency bin in the initial subband is greater than a frequency from the frequency bin in any other subband in the M subbands except, and wherein the first frequency band is within the first channel signal and the second channel signal.

24. The multi-channel signal encoder of claim 14, wherein the processor is further configured to:

select, based on an energy of N subbands from the downmixed signal, J target subbands from the N subbands, wherein an energy of any subband in the J target subbands is greater than an energy of any subband in the N subbands excluding the J target subbands, wherein both N and J are integers greater than 0, and wherein J is less than N; and select the reverberation gain parameters corresponding to the J target subbands as the target reverberation gain parameters.

* * * * *

UNITED STATES PATENT AND TRADEMARK OFFICE
CERTIFICATE OF CORRECTION

PATENT NO. : 10,827,297 B2
APPLICATION NO. : 16/601104
DATED : November 3, 2020
INVENTOR(S) : Zexin Liu and Lei Miao Page 1 of 1

It is certified that error appears in the above-identified patent and that said Letters Patent is hereby corrected as shown below:

In the Claims

Claim 11, Column 40, Line 46: "bin in another subband" should read "bin in any other subband"

Claim 23, Column 42, Line 58: "M subbands except, and" should read "M subbands, and"

Signed and Sealed this
Fifth Day of January, 2021

Andrei Iancu
*Director of the United States Patent and Trademark Office*